United States Patent [19]
Machida

[11] Patent Number: 5,339,268
[45] Date of Patent: Aug. 16, 1994

[54] CONTENT ADDRESSABLE MEMORY CELL AND CONTENT ADDRESSABLE MEMORY CIRCUIT FOR IMPLEMENTING A LEAST RECENTLY USED ALGORITHM

[75] Inventor: Hirohisa Machida, Hyogo, Japan

[73] Assignee: Mitsubishi Denki Kabushiki Kaisha, Tokyo, Japan

[21] Appl. No.: 980,865

[22] Filed: Nov. 24, 1992

[30] Foreign Application Priority Data

May 8, 1992 [JP] Japan .................. 4-116131

[51] Int. Cl.$^5$ .............................................. G11C 15/04
[52] U.S. Cl. .................. 365/49; 365/189.05; 365/189.07; 365/189.08
[58] Field of Search .............. 365/49, 45, 189.05, 365/189.07, 189.08

[56] References Cited

U.S. PATENT DOCUMENTS

| | | | |
|---|---|---|---|
| 4,532,606 | 7/1985 | Phelps | 365/49 |
| 4,965,767 | 10/1990 | Kinoshita et al. | 365/49 |
| 5,184,320 | 2/1993 | Dye | 365/49 |
| 5,226,005 | 7/1993 | Lee et al. | 365/49 |
| 5,258,946 | 11/1993 | Graf | 365/49 |

Primary Examiner—Eugene R. LaRoche
Assistant Examiner—Andrew Q. Tran
Attorney, Agent, or Firm—Lowe, Price, LeBlanc & Becker

[57] ABSTRACT

A content addressable memory circuit includes a plurality of CAM cell circuits provided in a matrix of rows and columns, a matching line arranged corresponding to each row, and a rewrite control circuit for generating a rewrite instruct signal according to a signal on the matching line. The CAM cell circuit includes a master memory portion for storing a reference data to be compared, a slave memory portion for storing data of an adjacent word, transfer element for transferring to the master memory portion the data stored in the slave memory portion according to a rewrite instruct signal from the rewrite control circuit, and a comparison/-driving portion for comparing an input data transmitted to a bit line with the data stored in the master memory portion to drive an associated matching line according to the comparison result. The stored data in the CAM cell circuit is updated according to a shifting operation. The input data is stored in the CAM cell circuit of a certain address. The least recently accessed data is always stored in the CAM cell circuit of another certain address. A content addressable memory circuit is obtained that executes LRU algorithm at a high speed.

6 Claims, 15 Drawing Sheets

CONTENT ADDRESSABLE MEMORY CELL AND CONTENT ADDRESSABLE MEMORY CIRCUIT FOR IMPLEMENTING A LEAST RECENTLY USED ALGORITHM

BACKGROUND OF THE INVENTION

1. Field of the Invention

The present invention relates to a content addressable memory circuit used in a content addressable memory system, and to the structure of a content addressable memory cell used in such a content addressable memory circuit.

2. Description of the Background Art

In systems utilizing microprocessors, a memory structure of at least two levels is generally used including an external storage unit of low speed and large storage capacity such as a magnetic disk, and a storage unit using semiconductor devices having a speed higher than that of a disk storage unit. A memory device which is directly accessed by a microprocessor is generally formed of a semiconductor device.

A memory device using a semiconductor device includes a dynamic type semiconductor memory device (DRAM) carrying out dynamic operation, and a static type semiconductor memory device (SRAM) carrying out static operation. A DRAM requires a signal line to be precharged to a predetermined potential for this dynamic operation, and is generally slower than a SRAM. In systems using a processor such as a microprocessor, a DRAM circuit operating at a relatively low speed and having a large storage capacity, and a SRAM circuit operating at a high speed but having only a small storage capacity are used so as not to degrade the high speed performance of the processor.

FIG. 9 shows a conventional structure of a data processing system using a processor. Referring to FIG. 9, the data processing system includes a processor 31 formed of, for example, a microprocessor, a cache memory 30 operating at a high speed, and a DRAM circuit 34 serving as the main memory of a large storage capacity. The cache memory 30 includes a high speed operating SRAM circuit 33 of a small storage capacity, and a CAM circuit 32 for storing the tag address of the data stored in the SRAM circuit 33.

The data required by the processor 31 is generally stored in the DRAM circuit 34 of a large storage capacity. Regarding the data stored in this DRAM circuit 34, the data used frequently by the processor 31 is stored in the SRAM circuit 33 in the cache memory 30. The processor 31 normally accesses the SRAM circuit 33 in the cache memory 31. The SRAM circuit 33 operates at a high speed. Therefore, the high speed operating performance of the processor 31 is not degraded and data processing can be executed at high speed in the case where the processor 31 frequently uses the data stored in the SRAM circuit 33. When the processor 31 uses data not stored in the SRAM circuit 33, the processor 31 accesses the DRAM circuit 34.

By establishing a hierarchical structure of a memory with a high speed operating cache memory 30 and a DRAM circuit 34 of large storage capacity but of low speed, the processor 31 can behave as if a high speed memory device of large storage capacity is used, since the frequently used data is stored in the cache memory 30 that operates at high speed. Therefore, the data processing system can operate at a high speed.

A CAM circuit 32 is provided in the cache memory 30 for making determination on whether the data required by the processor 31 exists or not in the SRAM circuit 33. The CAM circuit 32 stores the tag addresses of the data stored in the SRAM circuit 33. In general, a data block from the DRAM circuit 34 serving as a main storage is transferred to the SRAM circuit 33 to be stored therein. The tag address stored in the CAM circuit 32 is the address section common to each data in that data block. The SRAM circuit 33 does not store fixed data. According to the requirements of the processor 31, the data area on the DRAM circuit 34 stored by the SRAM circuit 33 varies. However, localization exists in the memory region accessed by the processor 31 in certain data processing. In other words, when a certain data is accessed, there is a high possibility that data of a succeeding address or data proximate thereto will be accessed. This means that the data fetched from the DRAM circuit 34 serving as the main memory to be stored in the SRAM circuit 33 of the cache memory 30 according to a request from the processor 31 may be accessed by the processor 31 thereafter for some time period in a high probability. If the data of the DRAM circuit 34 is stored into the SRAM circuit 33 of the cache memory 30, the high speed operation of this SRAM circuit 33 is fully exhibited to realize memory access of the processor 31 with no waiting (no wait). The processor 31 will not have its processing operation delayed by the memory access time.

The CAM circuit 32 receives the tag address section of an address signal ADD provided from the processor 31 to the address bus 36 to make comparison with a tag address stored therein. When the tag address supplied on the address bus 36 matches the tag address stored in the CAM circuit 32, the CAM circuit 32 generates a signal CH on the signal line 37. The cache memory is said to be "hit" if there is data needed by the processor 31 in the cache memory 30. The signal CH is activated when the cache memory is hit. The processor 31 responds to the cache hit signal CH on the signal line 37 to access the SRAM circuit 33 or the DRAM circuit 34.

As described above, the CAM circuit 32 functions to compare a provided tag address with a tag address stored therein to generate a signal indicating the comparison result. The CAM circuit 32 can also write and read an externally applied data such as a typical memory circuit. A memory circuit called a content addressable memory is used in the CAM circuit 32.

FIG. 10 shows the functional structure of a CAM circuit. Referring to FIG. 10, the CAM circuit 32 includes a storage region 102 for storing a tag address, and an input circuit 101 for entering a data to be compared (a tag address). In FIG. 10, the storage region 102 is shown including 256 address regions A0–A255. The tag address of the data stored in the SRAM circuit is stored in each of the address regions of A0–A255. Each of address regions A0–A255 of the storage region 102 compares the input data D0–D7 from the input circuit 101 with the tag address stored therein to transfer a signal indicating the comparison results to a matching line 104. A matching line 104 is provided corresponding to each address region.

The CAM circuit further includes a match detection circuit 103 responsive to a signal applied to the matching line 104 for detecting whether the input data D0–D7 provided from the input circuit 101 matches any of the tag addresses stored in the storage region 102. When a tag address stored in any of the address regions A0–A255 of the storage region 102 matches the tag addresses D0–D7 provided from the input circuit 101, the corresponding matching line 104 indicates a matching state. The match detection circuit 103 responds to a match indicating signal on the matching line 104 to generate a cache hit signal CH.

As described above, access to the SRAM circuit 33 is carried out at the time of cache hit in which the cache memory is hit. At the time of cache miss when the cache memory is not hit, access to the DRAM circuit is carried out. At this time, the data block including the accessed data is transferred to the SRAM circuit 33 parallel to the access to the DRAM circuit. The data transfer operation from the DRAM circuit to the SRAM circuit at the time of a cache miss is schematically shown in FIG. 11.

Referring to FIG. 11, a case is considered where the data requested by the processor 31 is included in a data block DB1 in a region in the DRAM circuit 34. The data block DB1 is transferred to the SRAM circuit 33. The address common to the words included in the data block DB1 is the tag address.

The data DB2 stored in a region A in the SRAM circuit 33 is transferred back to a corresponding region A2' in the DRAM circuit 34 (in the case of a copy back operation). The least recently accessed region is selected (LRU logic) as the region A in the SRAM circuit 33. Therefore, at the time of a cache miss, a new data block DB1 is transferred from the DRAM circuit 34 to the SRAM circuit 33, and rewriting of the tag address is executed in the CAM circuit 32. The CAM circuit 32 has a data rewriting function, i.e. data input/output function for executing the rewrite of a tag address in the CAM circuit 32.

FIG. 12 shows an example of a specific structure of a CAM circuit. Referring to FIG. 12, a CAM circuit includes a plurality of CAM cells 41 arranged in a matrix of rows and columns, an address decoder circuit 2 for decoding an address signal ADD provided via an address bus 8 to select CAM cells of one row, and a read/write circuit 3 for generating and transmitting to bit lines 6a and 6b an internal write data from data D provided via a data bus 9, and for generating an external read out data from the internal read out data transmitted from bit lines 6a and 6b at the time of data read out.

In FIG. 12, the CAM cells 41 are shown, as an example, being arranged in m rows and n columns, with reference numerals 41-11 . . . , 41-1n, . . . , 41-1m, . . . 41-mn. The address decoder circuit 2 includes m word lines 13-1 to 13-m to decode the address signal ADD provided via the address bus 8 to set one of the word lines to a selected state. The read/write circuit 3 carries out data input/output via the data bus 9, with a write data D and a read out data Q indicated together as DQ.

The CAM circuit further includes matching lines 11-1 to 11-m arranged corresponding to the word lines 13, and an OR circuit 10 to receive signals of matching lines 11-1 to 11-m for carrying out a logical sum operation. A cache hit signal CH is provided from the OR circuit 10 via a signal line 7.

One row of CAM cells are connected to each of matching lines 11-1 to 11-m. Each of matching lines 11-1 to 11-m is connected to receive a power potential 14 to be precharged to an H level (logical high) of the operating power potential Vcc level.

Bit lines 6a and 6b transmit signals complementary to each other. A signal having the same logic level of the input data is transmitted to the bit line 6a, and a signal having a logic opposite to the input data is transmitted to the bit line 6b. One column of CAM cells are connected to each pair of bit lines 6a and 6b.

Each of CAM cells 41-11 to 41-mn includes the function to compare the data provided to associated bit line 6a and 6b with a stored data to drive the associated matching line 11 according to the comparison results, in addition to the data storage function. The operation of the CAM circuit shown in FIG. 12 will be described briefly.

At the time of writing or reading data to or from a CAM cell, the address decoder circuit 2 decodes an address signal ADD provided via the address bus 8 to select one word line 13 (one of word lines 13-1 to 13-n). One row of CAM cells connected to the selected word line 13 are connected to the related corresponding bit lines 6a and 6b. At the time of data writing, an input from the read/write circuit 3 is transmitted to bit lines 6a and 6b. The selected CAM cell 41 stores the data on the corresponding bit lines 6a and 6b. At the time of data reading, the CAM cell 41 provides the stored data to the corresponding bit lines 6a and 6b. The data output to bit lines 6a and 6b are provided to the data bus 9 via the read/write circuit 3.

The match detecting operation will be described hereinafter. In this case, the address decoder circuit 2 is at an inactive state, and the decoding operation is not carried out. The read/write circuit 3 generates an internal data from the data provided from the data bus 9 to transmit the same to bit lines 6a and 6b. Here, one word line corresponds to one word. The matching line 11 is precharged to a H level. A data bit is transmitted to each bit line pair from the read/write circuit 3. Each CAM cell 41 compares the data provided on the corresponding bit lines 6a and 6b with the data already stored therein. If the data on the corresponding bit lines 6a and 6b match the stored data, the CAM cell 41 holds the matching line 11 at a floating state. When the data of the corresponding bit lines 6a and 6b do not match the stored data, the CAM cell 41 has the corresponding matching line 11 discharged to ground potential. Therefore, in the case the input data provided from the read/write circuit 3 matches the data bit stored respectively in one row of CAM cells, the potential of the matching line 11 attains a H level of the power potential. If there is a mismatch in any of the bits, the corresponding matching line 11 is discharged to ground potential to attain a L level.

The OR circuit 10 takes the logical sum of the signals on matching lines 11-1 to 11-m. Therefore, when one matching line 11 attains a H level indicating a matching state, a cache hit signal CH of a H level indicating an active state is sent to the signal line 7 from the OR circuit 10.

As mentioned above, one row of memory cells connected to one word line 13 corresponds to one word, whereby the read/write circuit 3 carries input/output of data in the unit of a word. A signal indicating the comparison result between each bit of a word and the input data is transmitted to the matching line 11. The matching line 11 has a potential of H level only in the case of matching. By using the CAM circuit of FIG. 12, a signal indicating the match/mismatch of a tag address can be provided from the OR circuit 10 at a high speed.

FIG. 13 shows a specific structure of a CAM cell. Referring to FIG. 13, a CAM cell 41 includes access transistors 23a and 23b responsive to a word line selecting signal on the word line 13 for connecting storage nodes 24a and 24b to bit lines 6a and 6b, respectively, an n channel MOS (insulating gate type field effect) transistor 23c connecting the storage node 24b to ground potential 22 according to the data stored in the storage node 24a, an n channel MOS transistor 23d connecting the storage node 24a to ground potential 22 according to the data stored in the storage node 24b, and pull-up resistor elements 21a and 21b for coupling storage nodes 24a and 24b respectively to power potential 14. Transistors 23c and 23d implement a flipflop type latch circuit. By this latch circuit, the data transmitted to bit lines 6a and 6b are stored in storage nodes 24a and 24b.

The CAM cell 41 further includes an n channel MOS transistor 23f for receiving at its gate a signal on the bit line 6a, an n channel MOS transistor 23e responsive to the data on the bit line 6b for conducting to transmit ground potential 22, an n channel MOS transistor 23h coupling selectively the transistor 23f to the matching line 11 according to the data stored in the storage node 24b, and an n channel MOS transistor 23g for selectively transmitting to the matching line 11 ground potential 22 transmitted by the transistor 23e, according to the stored data in the storage node 24a. Transistors 23e, 23f, 23g and 23h carry out the determination of match/mismatch between stored data and data on bit lines 6a and 6b to drive the matching line 11 according to the determination result.

The matching line 11 has the comparison/driving portion of each CAM cell 41 coupled in a wired-AND fashion. In the following description, the horizontal direction in FIG. 13 is referred to as the bit direction, and the vertical direction is referred to as the word direction. The operation of the CAM cell shown in FIG. 13 will be described hereinafter.

(1) Data storing operation

The operation of storing data into a CAM cell in a CAM circuit is similar to that of a memory circuit such as DRAMs and SRAMs. More specifically, in the case of storing data into the CAM cell 41, write data (data to be stored) is transmitted to bit lines 6a and 6b, and a word line selecting signal is transmitted to the word line 13. When the signal potential of the word line 13 attains a H level, access transistors 23a and 23b are turned on, whereby storage nodes 24a and 24b are connected to bit lines 6a and 6b, respectively.

Now, the case is considered where the data of bit lines 6a and 6b are "H" and "L", respectively. In this case, the potential of the storage node 24a attains a H level, and the potential of the storage node 24b attains a L level. Because the potential of the storage node 24b is at a L level, transistor 23d is turned off. The transistor 23c is turned on because of a H level potential of the storage node 24a. Accordingly, the storage node 24a is pulled up via the resistor element 21a to attain a H level, whereas the storage node 24b is discharged to ground potential 22 via the transistor 23c to maintain the L level. Thus, the data of "H" and "L" transmitted to bit lines 6a and 6b are stored in storage nodes 24a and 24b, respectively.

In this state, the transmitted data on the bit lines 6a and 6b match the stored data in storage nodes 24a and 24b. The matching line 11 is held at a floating state by transistors 23e, 23f, 23g and 23h.

(2) Data reading operation

The data reading operation is similar to the above described data writing operation, except that the direction of the data flow is different. More specifically, by the rise in potential of the word line 13, storage nodes 24a and 24b are connected to bit lines 6a and 6b, and the data stored in storage nodes 24a and 24b are transmitted to bit lines 6a and 6b, respectively. The data transmitted to bit lines 6a and 6b are transmitted to read/write circuit 3 to be detected/amplified and provided therefrom.

(3) Data comparison operation

It is assumed that the H level potential supplied from the power potential 4 corresponds to logic value "1" and the L potential supplied from ground potential 22 corresponds to logic value "0". It is assumed that a signal line provides a logic value of 0 when that signal line is connected to both power potential 14 and ground potential 22. Because the matching line 11 is connected to power potential 14, as shown in FIG. 12, the signal on that matching line 11 is normally logic value 1.

Consider a case where data 1 is stored in the CAM cell 41. More specifically, storage node 24a stores 1 and storage 24b stores 0 in FIG. 13. The external data to be compared are transmitted via the read/write circuit 3. When the data to be compared is 1, bit lines 6a and 6b become 1 and 0, respectively. At this time, the transistor 23f is turned on, and transistor 23e is turned off. Transistors 23g and 23h having their gates connected to storage nodes 24a and 24b, respectively, are turned off and on, respectively. Under this state, the matching line 11 maintains 1 because ground potential 22 is not connected thereto.

When the CAM cell 41 stores data 0 and the external data to be compared is 0, transistors 23g and 23f are similarly turned off, and transistors 23e and 23h are turned on, so that the matching line 11 is not coupled to ground potential 22.

Thus, when the data stored in the CAM cells 41 along the bit direction are equal to the bit values of the external data to be compared, the matching line 11 takes a logic value of 1 because it is not coupled to ground potential 22, as described above. In other words, when there is a data in the CAM circuit that matches the external data to be compared, the logic value of the matching line 11 is 1.

Consider a case where data 0 is stored in CAM cell 41, and the external data to be compared is 1. Storage nodes 24a and 24b are 0 and 1, respectively, and bit lines 6a and 6b are 1 and 0, respectively. At this state, transistors 23f and 23h are both turned on, and transistors 23e and 23g are turned off. The matching line 11 is coupled to ground potential 22 via transistors 23h and 23f.

Therefore, when there is at least one bit unequal data between the data to be compared and the stored data in all the CAM cells of one row arranged in the bit direction, the matching line 11 is connected to ground potential 22, so that the matching line 11 takes a logic value of 0 in the CAM cell 41.

As a result of comparing data stored in an arbitrary word (formed of CAM cells connected to one word line) with external data, the matching line 11 corresponding to that word takes a logic value of 1 when the comparison result is equal, and a logic value of 0 when not equal. Different data are stored in respective words in the CAM circuit. The logic values of the matching lines 11 can provide either a state where "only one matching line is 1", or where "all the matching lines are 0". The matching lines will not take a logic value of 1 for more than 1 word, because the contents of the stored word differs for each row.

If at least one matching line 11 indicates a logic value 1 in the CAM circuit 32, the cache hit signal CH provided to the signal line 7 takes a logic value of 1 by the OR circuit 10 shown in FIG. 12. When all the matching lines 11 take a logic value of 0, i.e. when the data to be used by the processor 31 does not exist in the cache memory 30, the cache hit signal CH of the signal line 7 takes a logic value of 0. The processor 31 recognizes whether the required data exist or not in the cache memory 30 according to the cache hit signal CH.

In the above description, a CAM circuit is used in the cache memory. The CAM circuit is also used in high speed conversion buffers called TLB (Translation Look-Aside Buffer) circuits. TLB circuit will be described briefly hereinafter. In processors such as of CPUs, various storage management systems are used. One of such a storage management system is a virtual storage system. In this virtual storage system, the program is created for a logical storage unit that is individually separated from the main storage which is the physical storage unit. The relating between the logical storage unit and the physical main storage unit is carried out at the time of program execution. The logical storage unit is called a virtual storage or virtual space, and the address on the virtual storage is called a virtual address. The address on the main storage unit is called a real address. The size of the virtual storage is not dependent on the size of the main storage.

A virtual storage normally has a structure divided into storage units called a page or a segment with a size of 2 to 64K bytes. The storage unit for physical storage of the virtual storage used by the program includes a main storage and a secondary storage of large capacity such as a magnetic disk. Data portions (pages or segments) that cannot be stored in the main storage is stored in the secondary storage. The page (segment) in the secondary storage is transferred to the main storage when required at the time of program execution. It is necessary to convert the virtual address into a real address at this time. The TLB circuit is used to carry out this conversion operation speedily. The operation of a TLB circuit used in address conversion in a segmentation system will be described briefly hereinafter.

FIG. 14 shows the functional structure for carrying out address conversion from a virtual address to a real address according to a segmentation system. In the segmentation system, the virtual space is founded of a plurality of segments. A segment is a unit having a logically complete meaning in the program. For example, a segment is an array data or a subroutine. A virtual address is formed of a segment number SN for identifying a segment, and a relative displacement D in the segment indicating a specific instruction or data in a segment.

For converting a virtual address into a real address, a segment table 201 serving as a corresponding table of a virtual address and a real address is provided. The segment table 201 includes an entry called a segment descripter provided in correspondence with all segments. The segment descripter 210 is provided corresponding to each segment. The contents of a segment descripter includes an existence flag indicating whether a corresponding segment exists or not on the main storage, the head address (real address) on the main storage of the segment in the case of existing on the main storage, and the size of the segment. The segment table 201 is generally provided in the main storage.

Consider a case where segment number Sn and an in-segment relative displacement D are provided as the virtual address. According to segment number Sn, a corresponding segment descripter is accessed from the segment table 201. When the existence flag in the segment descripter 210 indicates that the corresponding segment exists on the main storage, the head real address of the corresponding segment can be obtained by the head address included in the segment descripter. The in-segment relative displacement D is added to the real address by an adder 215. The output of the adder 215 is the real address corresponding to the required virtual address.

Such an address conversion is carried out for each execution of an instruction. The segment table 201 is often stored in the main storage which operates at a relatively low speed. This means that operation cannot be carried out speedily if the segment table 201 in the main storage is accessed every time address conversion is required. A TLB circuit 202 is provided for solving such problem.

Referring to FIG. 15, a pair of a head virtual address (segment number) and a corresponding real address of a recently accessed segment is held in the TLB circuit 202. The address conversion in accessing a segment held in the TLB circuit 202 is carried out using the address conversion pairs stored in the TLB circuit 202. More specifically, a segment number S is supplied to the TLB circuit 202, whereby determination of match/mismatch with the virtual address (the head virtual address of the segment) stored therein is carried out. The corresponding real address R is provided if there is matching virtual address.

If the required address conversion pair does not exist in the TLB circuit 202, access is made to the segment table 201 provided in the main storage to access a corresponding segment descripter 210. By selecting a real address from the TLB circuit 202 or a real address from the segment descripter 210 included in the segment table 201 with the OR circuit 220, the head real address of the segment 203 can be obtained.

In the above-described TLB circuit, a CAM circuit is employed for making determination of a match/mismatch between the segment number included in the virtual address and the virtual address stored therein.

FIG. 16 schematically shows the structure of a TLB circuit. Referring to FIG. 16, the TLB circuit includes a CAM array 250 formed of a plurality of CAM cells storing a segment number and a corresponding real address, an address decoder 252 for selecting one row (one word) in the CAM array according to a supplied address signal, an input/output circuit 254 for carrying out data input/output with respect to one word of CAM cells selected by the address decoder 252, a retrieval circuit 256 for generating an internal retrieval data according to an externally applied retrieval data and to apply a mask process to unnecessary data bits for transmitting the same to columns in the CAM array 250, and a resolver encoder 258 for detecting the match/mismatch between the retrieval data and the stored word data in the CAM array 250, and for providing the address of the matching word in case of matching.

The TLB circuit of FIG. 16 can carry out data writing and reading with respect to a desired word via the input/output circuit 254 by the operation of the address decoder 252, similar to a random access memory.

At the time of retrieval mode (comparison operation), the retrieval data (the segment number of the virtual address) from the retrieval circuit 256 is supplied to the CAM array 250. In each word, determination of match-/mismatch between the retrieval data from the retrieval circuit 256 and the stored word data is carried out. The determination result is provided to the resolver encoder 258 via the matching line. The resolver encoder 258 responds to a signal on the matching line from the CAM array 250 to provide a match signal indicating the match/mismatch and generates the address of the matching data word. The address from the resolver encoder 258 is supplied to the address decoder 252, whereby a word selecting operation is carried out to read out a corresponding real address Rn via the input-/output circuit 254.

The CAM cell included in the CAM array 250 of FIG. 16 has a structure similar to that of the above-described CAM circuit, except that a function to read out the data of a matching word is further included in the resolver encoder 258.

In the case where the data to be used by the processor 31 such as a microprocessor does not exist in the cache memory 30 in a CAM circuit used in the cache memory, it is necessary to transfer the data block including the required data to the SRAM circuit from the DRAM circuit serving as the main storage. It is also necessary to rewrite the tag address stored in the CAM circuit. Which address region in the SRAM circuit should be subjected to rewrite of a data block is determined according to a certain rule. More specifically, in the case of rewriting a tag address stored in the CAM circuit, the determination of which tag address should be rewritten is carried out according to a certain rule. An LRU algorithm is known as a rule of rewriting data in a cache memory. In the LRU (least recently used) algorithm, the recently least frequently used data is discarded and a new data is rewritten. Normal processors such as microprocessors have a feature to access continuously the same address region. Therefore, data substitution by LRU algorithm is most efficient.

However, it is necessary to identify which address was least frequently used in the case the LRU algorithm is used. An history indicating how and when each data and the cache memory was accessed must be stored. Storing such a history and carrying out data rewrite according to the stored history will become a very complicated process, which is usually carried out with a software.

The data transferred from, for example, a segment table, is a segment region recently used in the TLB circuit. If a corresponding virtual address is not stored in the TLB circuit, the contents must be rewritten by a segment descripter in the segment table. This rewriting also employs the LRU algorithm. The application of a TLB circuit utilizing a CAM circuit is not limited to the segmentation method, and can be employed in other virtual storage systems such as the page system, where the data substitution is carried out also according to LRU algorithm.

A procedure flow of the LRU algorithm is shown in FIG. 17. The LRU algorithm will be described briefly hereinafter with reference to FIG. 17.

At the time of system starting, each status value j indicating the access sequence corresponding to each entry (stored contents of address) of the CAM circuit is initialized (step S2).

Upon operation of the processor, the comparison determination operation is executed (step S4). If the cache is hit, the status value j corresponding to the hit entry (access address) is initialized, and the status value j corresponding to the remaining full entries (entries having valid data stored therein) is incremented by 1 (step S6).

If the cache is not hit (cache miss), determination is made whether all the entries of the CAM circuit store data or not (step S8). This determination can be made by checking the valid data bit provided corresponding to each entry. If all the entries in the CAM circuit store valid data, the address of the entry corresponding to the highest status value is provided. Furthermore, the highest status value of the address corresponding to this highest status value is initialized, and the status values corresponding to the remaining entries are incremented by 1 (step S12).

If data is not stored in all of the entries in the CAM circuit and there are still empty entries, the smallest address of the empty entries is provided. The status values j of the full entries are incremented by 1 (step S10). The operations of steps S6, S12, and S10 are repetitively executed until the termination of the system operation (step S14).

In the case of executing the above-described operation with a software, the procedure operation must be executed by the processor 31 itself, or by a processor dedicated to cache memory control or TLB circuit management in the memory system. It will be a great load to the processor 31 if the management of the cache memory is additionally executed by the processor 31, resulting in degradation of the processing performance of that processor. If a dedicated processor is used, the structure size of the system and also the cost thereof will be increased.

There is also a problem that the processing speed will be reduced in carrying out the procedure with a software, so that the processing operation at the time of cache miss cannot be executed speedily.

An example of a content addressable memory circuit realizing the LRU algorithm in a hardware manner is disclosed in Japanese Patent Laying-Open No. 61-204896. According to this prior art, the content addressable memory circuit includes a plurality of data registers each holding a comparison standard data, a plurality of comparison circuits for comparing the stored contents of each data register with an input data, and control means for rewriting the contents of the data register by a shifting operation according to the outputs of the plurality of comparison circuits. In the prior art, the contents of all data registers upstream of the data register holding the storage content matching the input data are rewritten by the shifting operation to an upstream adjacent data register. The input data is stored in the most upstream data register.

This prior art realizes LRU algorithm by the shifting operation of cascade-connected data registers. However, the data register and the comparison circuit are provided individually, in addition to a selecting circuit for controlling the shifting operation of a data register according to the output of a plurality of comparison circuits. This means that the complexity of the device is increased. There is no disclosure of the structure of the data register, and no suggestion of using a CAM cell.

SUMMARY OF THE INVENTION

An object of the present invention is to provide a content addressable memory circuit that can realized LRU algorithm speedily and easily with a hardware, and a content addressable memory cell used therein.

Another object of the present invention is to provide a content addressable memory circuit that can realize LRU algorithm by a hardware without increasing the occupying area on the chip, and a content addressable memory cell used therein.

A content addressable memory cell according to the present invention is provided corresponding to a crossing between a bit line and a word line, and functions to compare an input data with a stored data to drive a matching line according to the comparison result thereof, and to transfer that stored data into the memory cell of an adjacent word.

The content addressable memory cell according to the present invention includes a main storage responsive to a signal on a word line for storing data on a bit line, a comparator for comparing the data on the bit line and the data stored in the main storage to drive a matching line to a predetermined potential according to the match/mismatch of the data, sub-storage, data transfer responsive to a transfer instruct signal for transferring and storing into the sub-storage the data stored in the main storage of a memory cell adjacent along the word direction, and data rewriter responsive to a rewrite instruct signal for transferring and storing the data stored in the sub-storage to the main storage.

In addition to carry out determination of match/mismatch between an input data and a stored data, the content addressable memory circuit according to the present invention functions to transfer the contents of each word to an adjacent word with the matching word as the lower limit and to store an input data to the upmost word when determination is made of a match.

This content addressable memory circuit includes a plurality of word lines each defining a row, a plurality of bit lines each defining a column, a plurality of matching lines arranged corresponding to each word line, and a plurality of memory cells provided corresponding to a crossing between a word line and the corresponding matching line and a bit line.

Each of the plurality of memory cells includes the above-described structure.

The content addressable memory circuit according to the present invention further includes a rewrite controller responsive to signals of a plurality of matching lines for generating a rewrite instruct signal for each row. The rewrite controller includes a divider for grouping a plurality of matching lines into a first group of continuously adjacent matching lines including a matching line indicating a match and matching line corresponding to memory cells of a row having the data transmitting line coupled to the bit line, and a second group of the remaining continuously adjacent matching lines, when any of the plurality of matching lines indicate a match; and a rewrite signal generator responsive to the output of the divider for generating and providing the rewrite instruct signal only to the row of memory cells corresponding to the matching lines of the first group.

A content addressable memory cell according to another aspect of the present invention is provided at a crossing of a matching line and a bit line for comparing an input data with a stored data to drive a matching line according to the comparison result, and for transferring a data into the memory cell of an adjacent word.

A content addressable memory circuit according to another aspect of the present invention includes a plurality of matching lines arranged in the row direction, a plurality of bit lines arranged in the column direction, and a plurality of memory cells provided corresponding to a crossing of the bit line and the matching line and having a structure according to the above-described another aspect.

The memory cells having the data of the bit line transmitted to the data transmitting line is limited to one row of memory cells.

The content addressable memory circuit according to another aspect of the present invention further includes a rewrite controller responsive to signals of a plurality of matching lines for generating a rewrite instruct signal for each row. The rewrite controller includes a divider for dividing into a first group of a plurality of matching lines corresponding to continuously adjacent rows including a row corresponding to a matching line indicating a match and a row of a memory cell including a data transmitting line to which the data on the bit line is transmitted, and a second group of continuously adjacent matching lines associated with a row of the remaining memory cell when any of the plurality of matching lines indicate a match, and rewrite signal generator responsive to an output of the divider for transmitting a data rewrite instruct signal to only a memory cell of the first group.

In the content addressable memory cell according to the present invention, the data of the adjacent word held in the sub-storage is stored in the main storage by a rewrite instruct signal. Thus, it is possible to shift the storage position of the data word to obtain a content addressable memory cell that can realize speedily LRU algorithm with a compact structure.

In the content addressable memory circuit according to the present invention, the contents of the content addressable memory cell upstream of the matching content addressable memory cell is rewritten by the stored content of an adjacent upstream word or by an input word data according to a rewrite instruct signal, whereby a content addressable memory circuit is obtained that realizes the management of stored contents according to LRU algorithm efficiently at high speed with a simple structure.

The content addressable memory cell according to another aspect of the present invention is not supplied with a word line, and the storage of an adjacent word data is carried out only by a shifting operation, whereby LRU algorithm can be realized with a simple structure.

The content addressable memory circuit according to another aspect of the present invention is not provided with a word line, and can rewrite a data word in a desired region by a shifting operation of a rewrite controller, whereby a content addressable memory circuit of a compact structure that can manage the stored contents according to LRU algorithm at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
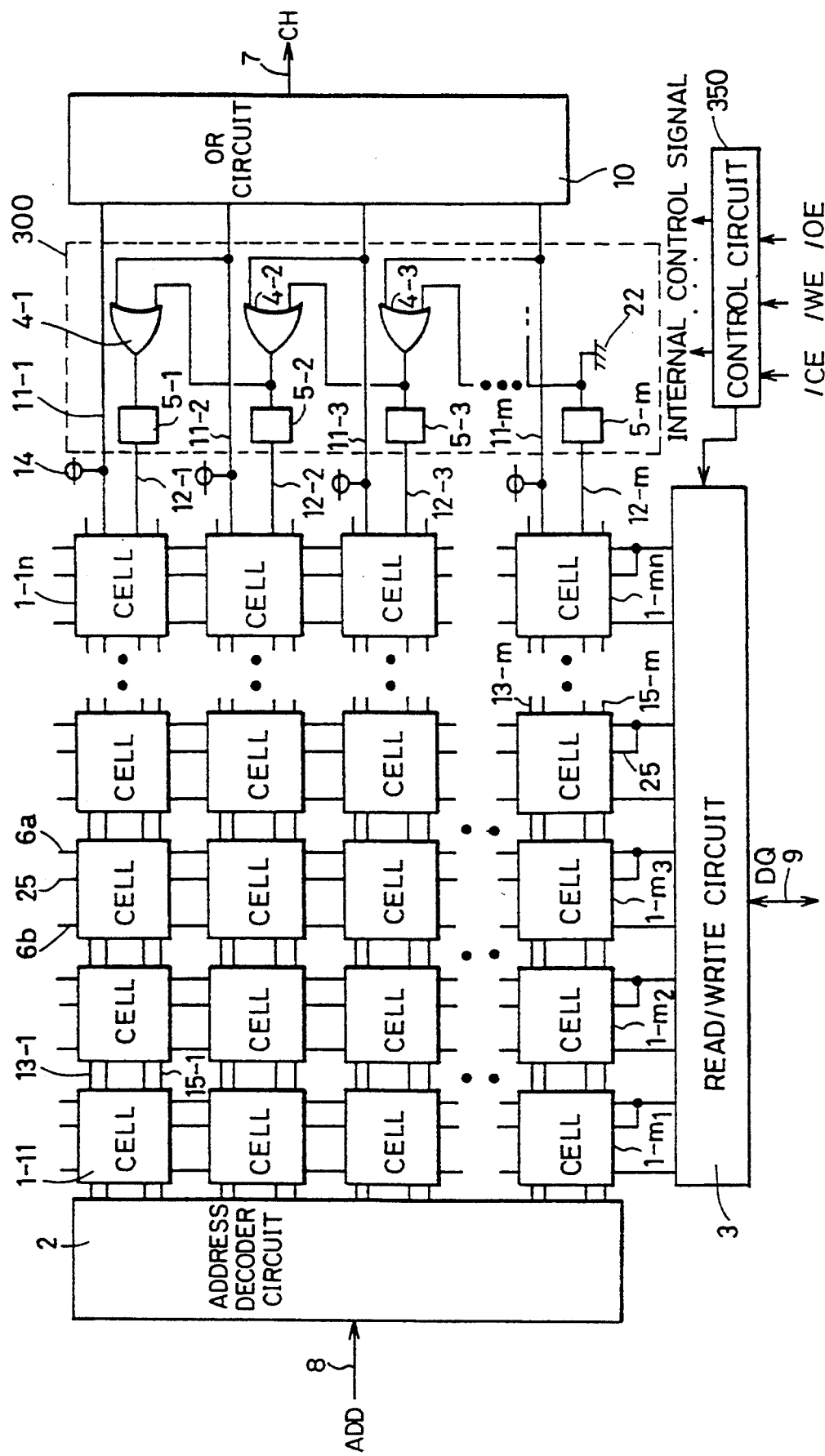
FIG. 1 is a block diagram showing the entire structure of a content addressable memory circuit according to an embodiment of the present invention.

FIG. 1 is a block diagram schematically showing an entire structure of a CAM circuit according to an embodiment of the present invention.

Referring to FIG. 1, a CAM circuit includes a plurality of CAM cell circuits 1 arranged in a matrix of rows and columns. FIG. 1 shows the CAM cell circuits 1 arranged in m rows and n columns. Each CAM cell circuit is identified with reference numerals 1-11, . . . , 1-1n, 1-m1, . . . 1-mm. The CAM cell circuit 1 (a CAM cell circuit shown representatively) includes a data holding portion, a comparison portion, and a data rewriting portion which will be described in detail afterwards.

One word line is provided for one row of CAM cell circuits 1-k1-1kn, where $1 \leq k \leq m$. A pair of bit lines 6a and 6b is provided to one column of CAM cell circuits 1-1i to 1-mi. Also, one matching line 11 is provided for one row of memory cells 1-k1 to 1kn.

Furthermore, a rewrite signal line 12 for transmitting a rewrite instruct signal to each row of CAM cell circuits 1-k1 to 1-kn is provided in the CAM circuit for controlling data rewrite of the CAM cell circuits.

A data transmitting line 25 is provided between the CAM cell circuits of adjacent words (adjacent lines). The stored data in an adjacent word is transmitted to the data transmitting line 25. The data transmitting lines 25 of the CAM cell circuits 1-ml to 1-mn of the row nearest to the data input portion (read/write circuit 3) are connected to bit lines 6a. With this structure, CAM cell circuits 1-ml to 1-mn can store the input data provided on the bit lines 6a from the read/write circuit 3.

The CAM cell circuit further includes a rewrite control circuit 300 for transmitting a rewrite signal to each rewrite signal lines 12-1 to 12-m according to the signal (match signal) of matching lines 11-2 to 11-m. The rewrite control circuit 300 includes gate circuits 4-1, 4-2, 4-3 . . . provided corresponding to each row for receiving a matching signal on the matching line of an adjacent row and the output of the gate circuit provided in the adjacent row, and rewrite signal generating circuits 5-1 to 5-m for transmitting a rewrite signal to a corresponding rewrite signal line 12-p ($1 \leq p \leq m$) according to the output of a corresponding gate circuit 4-p.

The rewrite signal generating circuit 5-m is normally connected to ground potential 22 and holds data 0. The rewrite signal generating circuit is formed of a data holding circuit of one bit to transmit a rewrite signal to a corresponding rewrite signal line according to the held data.

The gate circuit 4 (representatively showing circuits 4-1, 4-2, 4-3, . . .) is formed of an OR gate to generate a signal of "1" when at least one of the two inputs is "1".

The CAM cell circuits of one row connected to one word line form 1 word. It is here assumed that word line 13-1 is address 1, . . . , word line 13-m is address m ($m > 1$) as the address of the CAM circuits.

The CAM circuit further includes an OR circuit 10 for carrying out the determinating operation of match/mismatch according to matching signals on all the matching lines 11-1 to 11-m to provide a signal CH indicating the determination result to the signal line 7, an address decoder circuit 2 for decoding the address signal ADD applied via an address bus 8 to set one of the m word lines to a selected state, a read/write circuit 3 for carrying out data reading and writing, and a control circuit 350 for generating a signal to control the operation such as of the address decoder circuit 20 and the read/write circuit 3. The control circuit 350 is shown having a structure generating various internal control signals according to a chip enable signal /CE, a write enable signal /WE and a read enable signal /OE. The control circuits 350 may be implemented so as to control the rewrite signal generation timing according to the data held in the rewrite signal generating circuits (circuits 5-1 to 5-m) in the rewrite control circuit 300, or so as to control the generation timing of the signal CH at the OR circuit 10.

The operation of the CAM circuit shown in FIG. 1 will be described briefly hereinafter. One word line 13 is selected by the address decoder circuit 2, whereby data reading/writing is carried out by the read/write circuit 3 via bit lines 6a and 6b.

In match detecting operation, two operations are carried out. In the first operation cycle, a transfer signal is applied to transfer signal lines 15-1 to 15-m (by control of the control circuit 350). As a result, the stored data of the CAM cell circuit of an adjacent word at the upstream side (the word closer to read/write circuit 3) is stored in the sub-storage portion of the CAM cell circuit 1. CAM cell circuits 1-m1 to 1-mn of the greatest address have the data transmitting line 25 connected to the bit line 6a. Therefore, the input data supplied to the bit line 6a is stored in the sub-storage portion. Then, a comparison operation is carried out. More specifically, identification of match/mismatch of the stored data transmitted to bit lines 6a and 6b are carried out in rows. Here, the data in the main storage portion is used for comparison. According to this comparison operation, the signal potential on matching lines 11-1 to 11-m is decided.

Consider a case where the matching line 11-2 is "1", and the remaining matching lines 11-1 and 11-3 to 11-m are "0". This is a case where the input data matches the data word stored in the CAM cell circuits of the second row. The output of the OR gate 4-1 becomes "1", and the outputs of the remaining gate circuits 4-2, 4-3, ... become "0". Data "1" is held in the rewrite signal generating circuit 5-1, and data "0" is held in the remaining rewrite signal generating circuits 5-2 to 5-m.

Then, a rewrite instruct signal indicating rewriting is transmitted from the rewrite signal generating circuits 5-2 to 5-m holding data "0" to corresponding rewrite signal lines 12-2 to 12-m. As a result, the data stored in the sub-storage portion of the CAM cell circuits in the second to m-th rows are transmitted to the main storage portion. In the CAM cell circuits of the first row, a rewrite instruct signal is not generated from the rewrite signal generating circuit 5-1, so that the data stored in the main storage portion thereof remains therein. Thus, the data stored in the CAM cell circuits of the second row are equivalently transferred to the CAM cell circuits of the m-th row having the greatest address. Also, the data stored in the CAM cell circuits of the third to m-th rows are transferred to the CAM cell circuits of the second to m-th rows, respectively. This means that the data most recently accessed is always stored in the CAM cell circuits 1-m1 to 1-mn of the m-th row. Therefore, the least recently accessed storage data is stored in the CAM cell circuits 1-11 to 1-n of the first row.

If matching lines 11-1 to 11-n are "0", rewrite signal generating circuits 5-1 to 5-m all hold data "0". A rewrite instruct signal is generated to rewrite signal lines 12-1 to 120m, whereby the stored contents of all CAM cell circuits 1 are rewritten by the data stored in the associated sub-storage portion. More specifically, the least recently accessed data stored in CAM cell circuit 1a-11 to 1-1m is erased, the stored contents of the CAM cell circuits of each row are shifted by one row, with the input data stored in the CAM cell circuits of the m-th row. This is the data substitution according to LRU algorithm.

Transfer signal lines 15-1 to 15-m are provided for respective rows. A data transfer signal is generated by a control signal from the control circuit 350.

The rewrite signal generating circuits 5-1 to 5-m are implemented with an inverter latch circuit, for example. The inverter latch circuit has the data output timing and the data latch timing determined by an internal control signal from the control circuit 350. The rewrite signal generating circuit may be implemented with a latch circuit including an inverter circuit comprising a clocked inverter. The input and output portion of the inverter latch circuit may have the on/off timing of its transfer gate controlled by an internal control signal from the control circuit 350.

Bit lines 6a and 6b may be precharged to 1 or to an intermediate potential between 1 and 0 before the comparison operation (at the standby state prior to the input data being transmitted). The address decoder circuit 2 may carry out the decode operation not under the control of the control circuit 350, but statically by the address signal ADD supplied to the address bus 8. The address decoder circuit 2 may be implemented to detect the transition point of the address signal ADD on the address bus 8 to have its decode timing determined in response to the transition point detection signal.

The read/write circuit 3 is similar to a conventional one. However, such a structure may be employed that the input data to be compared is transmitted to each of bit lines 6a and 6b from an input circuit provided separately from the read/write circuit 3.

Figure 2:
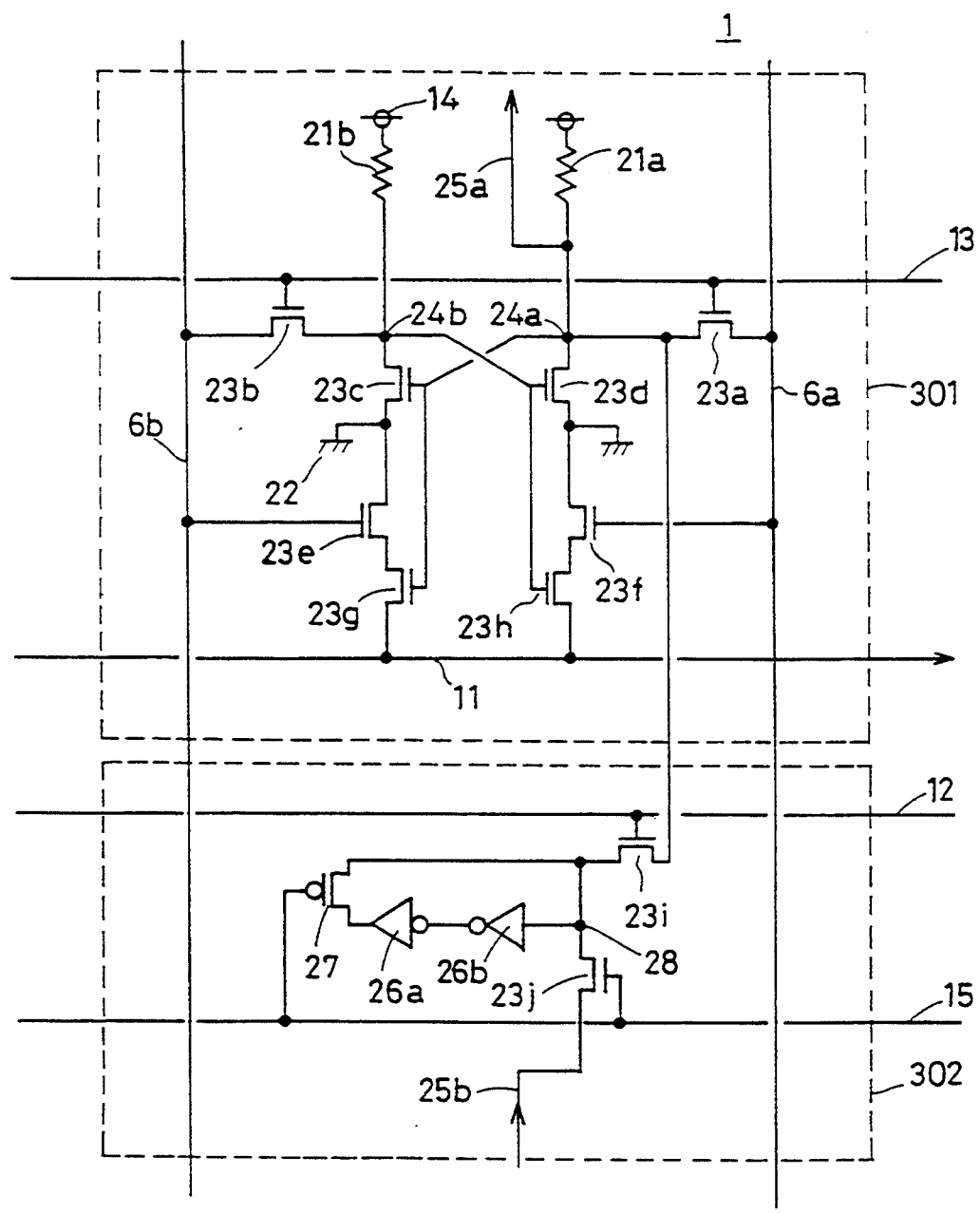
FIG. 2 specifically shows a structure of a CAM cell circuit used in the content addressable memory circuit of FIG. 1.

FIG. 2 specifically shows a structure of the CAM cell circuit 1 of FIG. 1. Referring to FIG. 2, the CAM cell circuit 1 includes a master memory portion 301 serving as the main storage, and a slave memory portion 302 serving as the sub-storage. The master memory portion 301 has a structure similar to that of the conventional CAM cell shown in FIG. 13, including a data storage portion, and a data comparison and matching line driving portion. The components of the master memory portion 301 corresponding to those of the conventional CAM cell of FIG. 13 have the same reference characters denoted and their detailed description will not be repeated. The storage node 24a of the master memory portion 301 is connected to the data transmitting line 25a. The data transmitting line 25a is connected to the slave memory portion of an adjacent word (for example, the adjacent word of the downstream side having a smaller address in FIG. 1).

The slave memory portion 302 includes an n channel MOS transistor 23j conducting in response to a data transfer instruct signal on the signal line 15 for transmitting the data transmitted on the data transmitting line 25b to a node 28, cascaded two stages of inverter circuits 26b and 26a for amplifying and latching the stored data in the node 28, a p channel MOS transistor 27 conducting in response to a data transfer instruct signal on the signal line 15 for transmitting the output of the inverter circuit 26a to the node 28, and an n channel MOS transistor 23i conducting in response to a rewrite instruct signal on a signal line 23 for transmitting the data stored in the node 28 to the storage node 24a of the master memory portion 301. Transistors 23j and 27 are turned on/off in a complementary manner. The data stored in the master memory portion of the CAM cell circuit of an adjacent upstream word having a greater address in FIG. 1 is transmitted to data transmitting line 25b. When this CAM cell circuit is the CAM cell circuit of the m-th row in FIG. 1, data transmitting line 25b is connected to the bit line 6a to transmit the input data from the read/write circuit 3. The operation of the CAM cell circuit shown in FIG. 2 will be described hereinafter.

Figure 13:
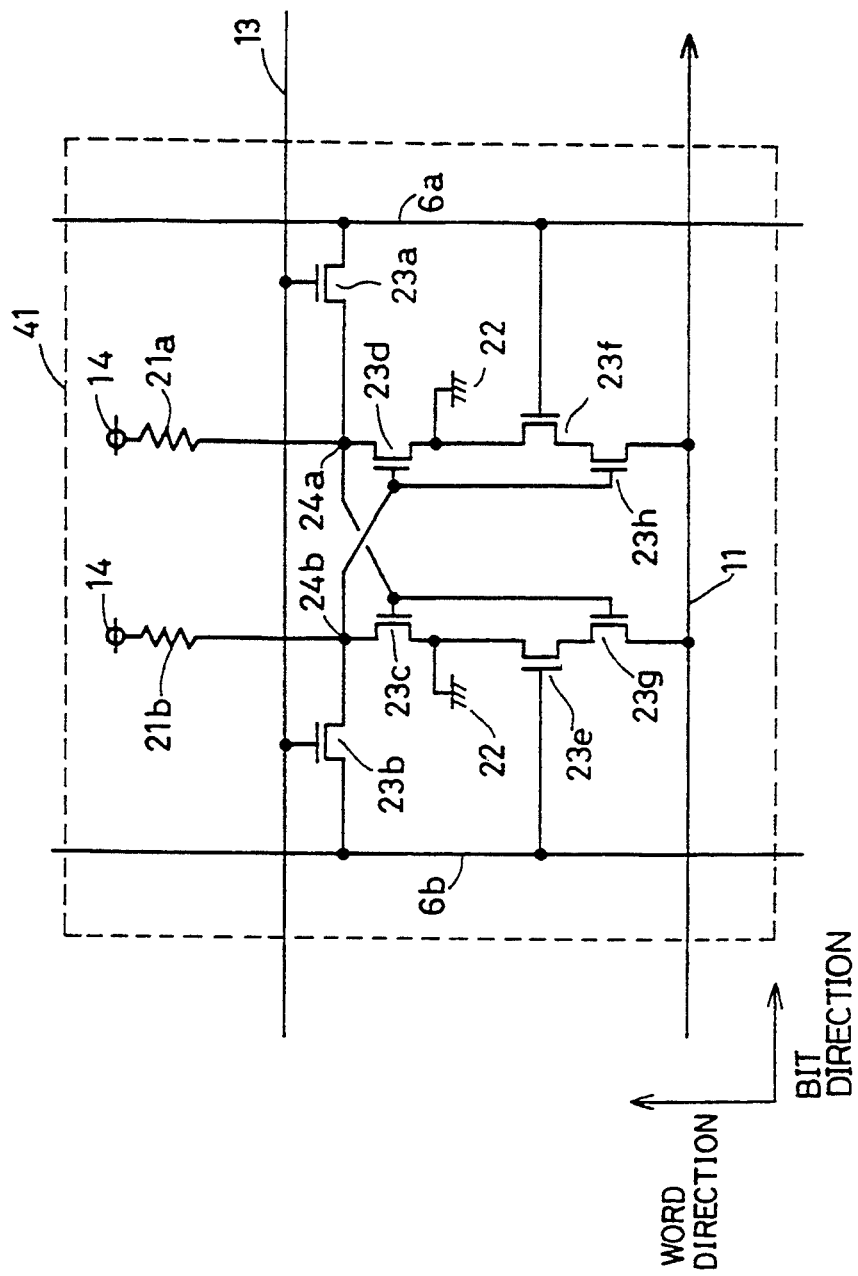
FIG. 13 specifically shows a structure of a conventional CAM cell.
Figure 14:
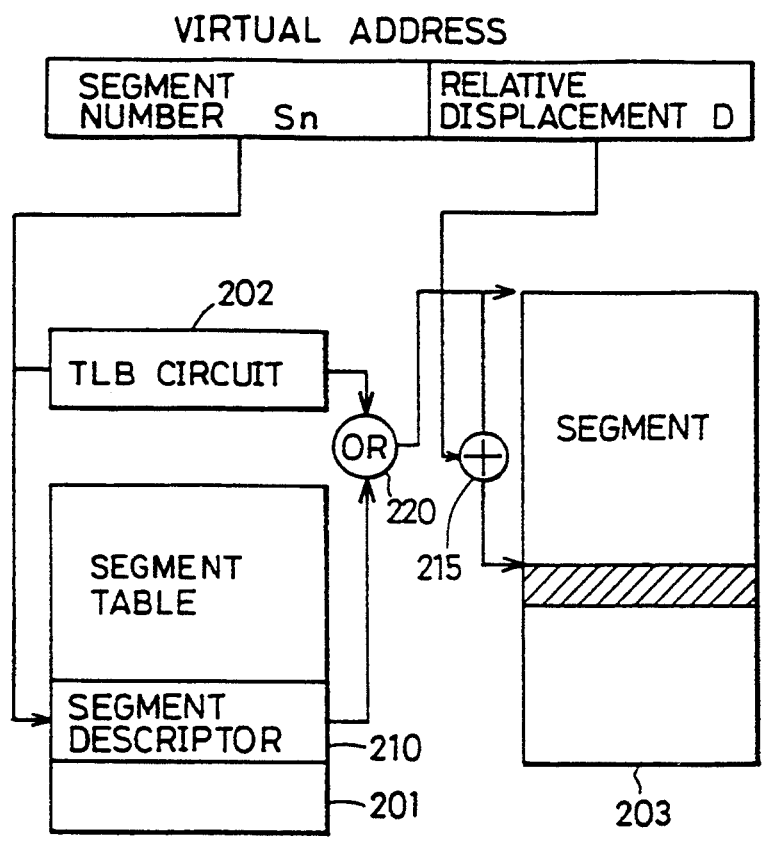
FIG. 14 schematically shows a structure of address conversion using a TLB circuit.
Figure 15:
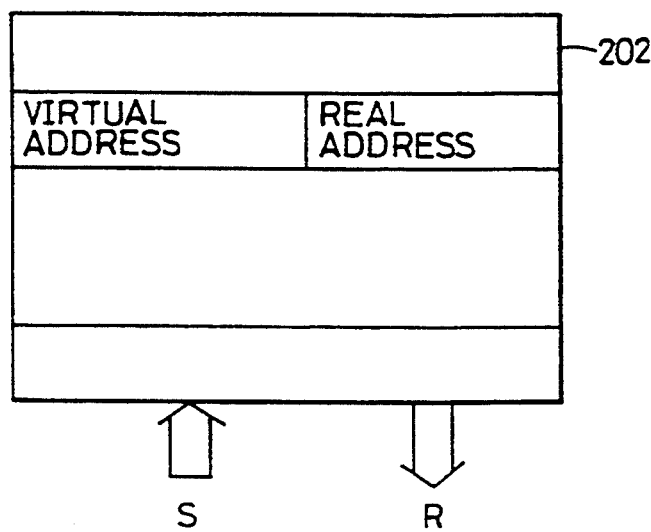
FIG. 15 is a diagram for describing the operation of the TLB circuit.
Figure 16:
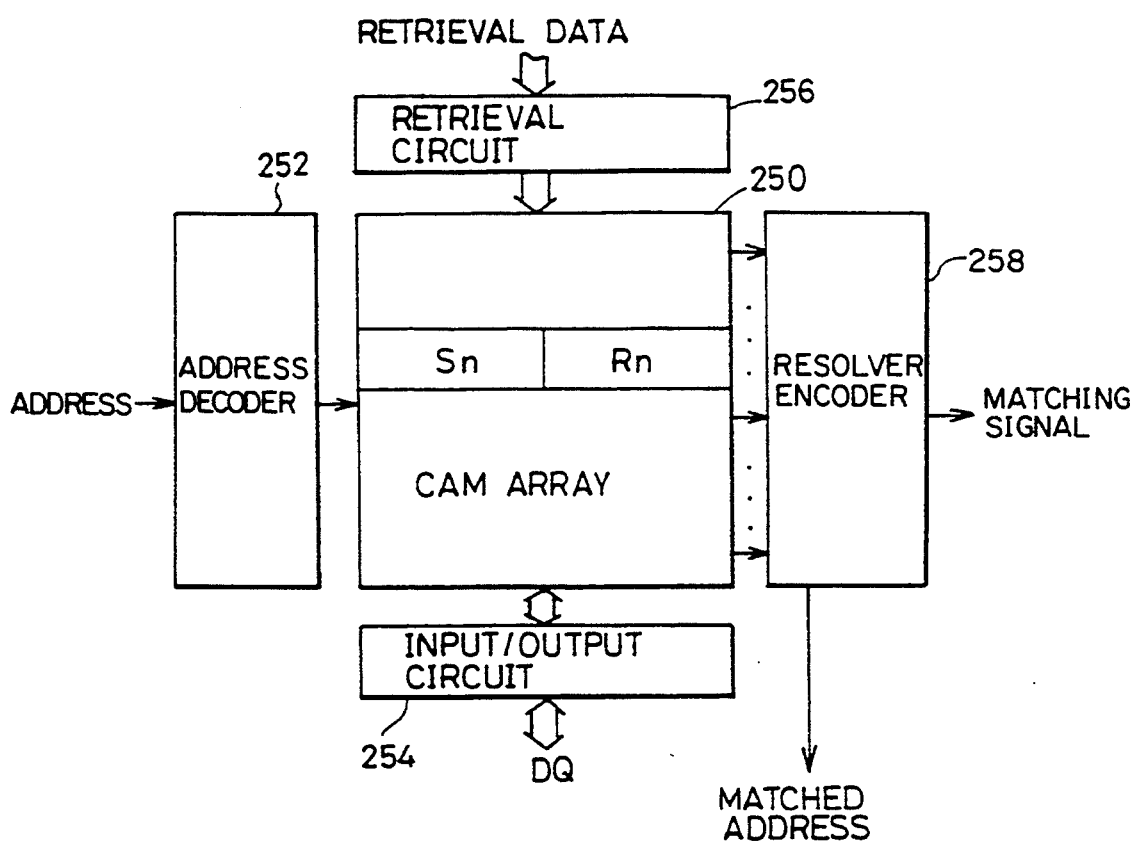
FIG. 16 schematically shows a structure of the TLB circuit.
Figure 17:
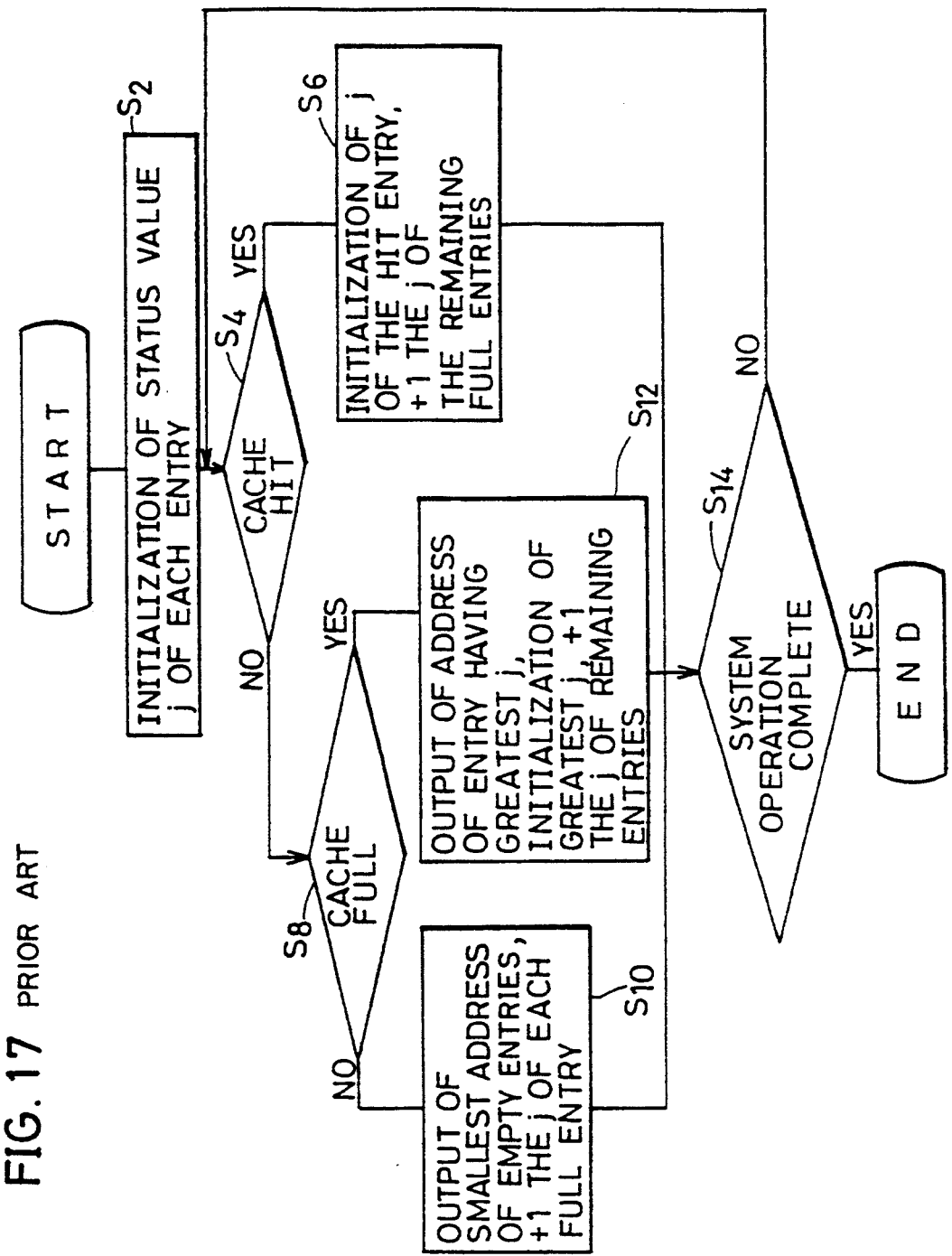
FIG. 17 is a flow chart indicating the procedure flow of LRU algorithm.

The operation of the master memory portion 301 carrying out data reading/writing and comparison operation is similar to that of the conventional CAM cell of FIG. 13. Therefore, the description of the writing/reading operation of the internal data will not be repeated, and the comparison operation, i.e. the matching determination operation will be described with reference to FIG. 3 which is an operation waveform diagram thereof.

Figure 3:
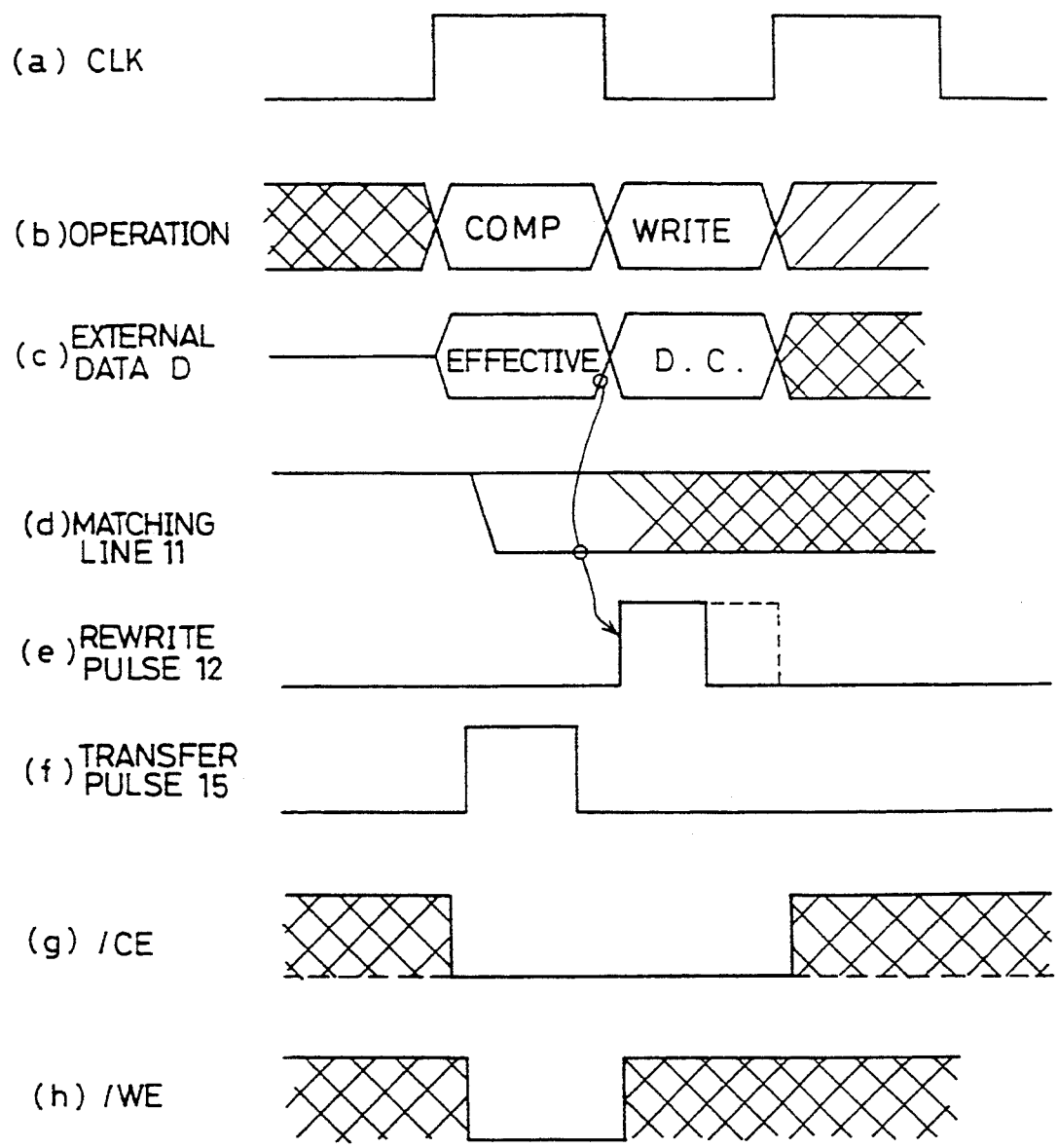
FIGS. 3(a)-3(h) are signal wave form diagrams indicating the operation of the circuit shown in FIGS. 1 and 2.

The CAM circuit according to the present invention operates in two phases. The first phase is the period "comp" in which the input data and the stored data are compared, and the other is the period "write" in which data is rewritten. This comparison period "comp" and this rewrite period "write" are respectively equivalent to half a cycle of a system clock CLK. Each control signal provided to the control circuit 350 of FIG. 1 is supplied from the processor in synchronization with the system clock signal CLK. Although the system clock signal CLK is not actually in synchronization with control signals /CE and /WE, they are depicted in FIG. 3 as to be substantially in synchronization.

In the comparison period "comp", the chip enable signal /CE attains an active state of "0", and also the write enable signal /WE attains an active state of "0". This causes the read/write circuit 3 to be activated, whereby an internal write data is generated from the external data provided on the data bus 9 to be transmitted to bit lines 6a and 6b. In this comparison period "comp", a transfer instruct signal is transmitted to the signal line 15 from the control circuit 350 in response to the write enable signal /WE. As a result, the transistor 23j is turned on, and the transistor 27 is turned off, whereby the data stored in the storage node 24a of the master memory portion 301 of an adjacent word is transmitted to the storage node 28 of the slave memory portion 302 in the CAM cell circuits of the first to m-th rows in FIG. 1. Because the transistor 27 is turned off, the inverter circuits 26a and 26b only carry out an amplifying operation. When the potential of the storage node is decided, the data transfer instruct signal falls to "0" to turn off the transistor 23j and turn on the transistor 27, whereby the inverter circuits 26b and 26a function as a latch circuit to store the storage data of the node 28.

In the CAM cells of the m-th row, the data transfer line 25b is connected to the bit line 6a, so that the input data transmitted from the read/write circuit 3 is stored in the node 28.

In parallel with this data transfer operation, a comparison operation between the data stored in storage nodes 24a and 24b and the input data transmitted to bit lines 6a and 6b is carried out in the master memory portion. A matching line 11 is driven according to the comparison result. In response to the logic value of the matching line 11, data 0 or 1 is stored in the rewrite signal generating circuits 5-1 to 5-m of the rewrite control circuit 300 of FIG. 1. When the settling time periods of the signal potential of the matching line 11, the output of the gate circuit 4, and the data in the rewrite signal generating circuit elapses, the comparison period "comp" ends. Then, the rewrite period "write" commences.

The rewrite period "write" is shown commencing in response to the fall of the clock signal CLK in FIG. 3. At the start of this rewrite period "write", a rewrite instruct signal is transmitted to the signal line 12 from rewrite signal generating circuits 5-1 to 5-m. In FIG. 3, the rewrite instruct signal (rewrite pulse) is shown to be generated in response to the fall of the clock signal CLK. This state corresponds to the state where the control circuit 350 responds to the clock signal CLK to control the operation of the rewrite signal generating circuit 5. When a rewrite pulse is generated on the signal line 12, the signal line 12 provides a logic value of 1 and the transistor 23i is turned on. The storage node 28 is driven by inverter circuits 26b and 26a. The driving capability of inverter circuits 26b and 26a is greater than the latching capability of transistors 23c and 23d. Therefore, the stored data in the storage node 24a of the master memory portion 301 is updated to the stored data of the storage node 28 of the slave memory portion 302. This operation is executed in the CAM cell circuit where the signal line 12 has a logic value of 1.

The CAM cell circuits of the m-th row (the row with the greatest address) in FIG. 1 each have the data transmitting line 25b connected to the bit line 6a, whereby the input data is stored in the node 28. Thus, the input data is stored in the CAM cell circuits of the m-th row.

By carrying out the above-described operation, data is rewritten in the CAM cell circuits having an address greater than the hit address during the rewrite period "write". The execution of data rewrite is equivalent to transferring and storing into a downstream CAM cell circuit the data stored in the CAM cell circuit 1 of one greater address before the comparison period comp. In the CAM cell circuits 1-ml to 1-mn of the greatest address, i.e. of the m-th row in FIG. 1, the input data on the bit line 6a used by the master memory portion 301 for comparison during the comparison period "comp" is transferred to the storage node 21a of the master memory portion 310. The data of the bit line 6a is equivalent to the data at the hit address. Therefore, this is an operation similar where the data at the hit address is written into the CAM cell circuits 1-ml to 1-mn of the greatest address, and the data at any address greater than the hit address is transferred to one smaller adjacent address.

If a rewrite instruct signal is not generated, the logic value of the signal line 12 is 0, and the transistor 23i maintains its OFF state. In this case, the data transfer operation is not executed, and the data stored in the storage node 24a of the master memory portion 301 is not updated.

If all the matching lines provide a logic value of 0 and no data in any address is hit during the comparison period "comp", a rewrite instruct signal is generated with respect to all the CAM cell circuits 1. This means that a rewrite operation is executed in the CAM cell circuits 1 of all addresses during the rewrite period "write". The execution of a rewrite operation in the CAM cell circuits 1 of all the addresses during the rewrite period "write" is equivalent to the operation where the to-be-compared data is written into the greatest address and the data in the smallest address is erased from the CAM cell circuit in replacement of the external data. The data stored in the CAM cell circuit at the smallest address (the first row in FIG. 1) is the least accessed data, i.e. the most ancient data least recently referred to by the processor. In the described case where no address is hit, data rewrite is executed according to LRU algorithm. The data comparison and rewriting operation will be described more specifically hereinafter.

Figure 4:
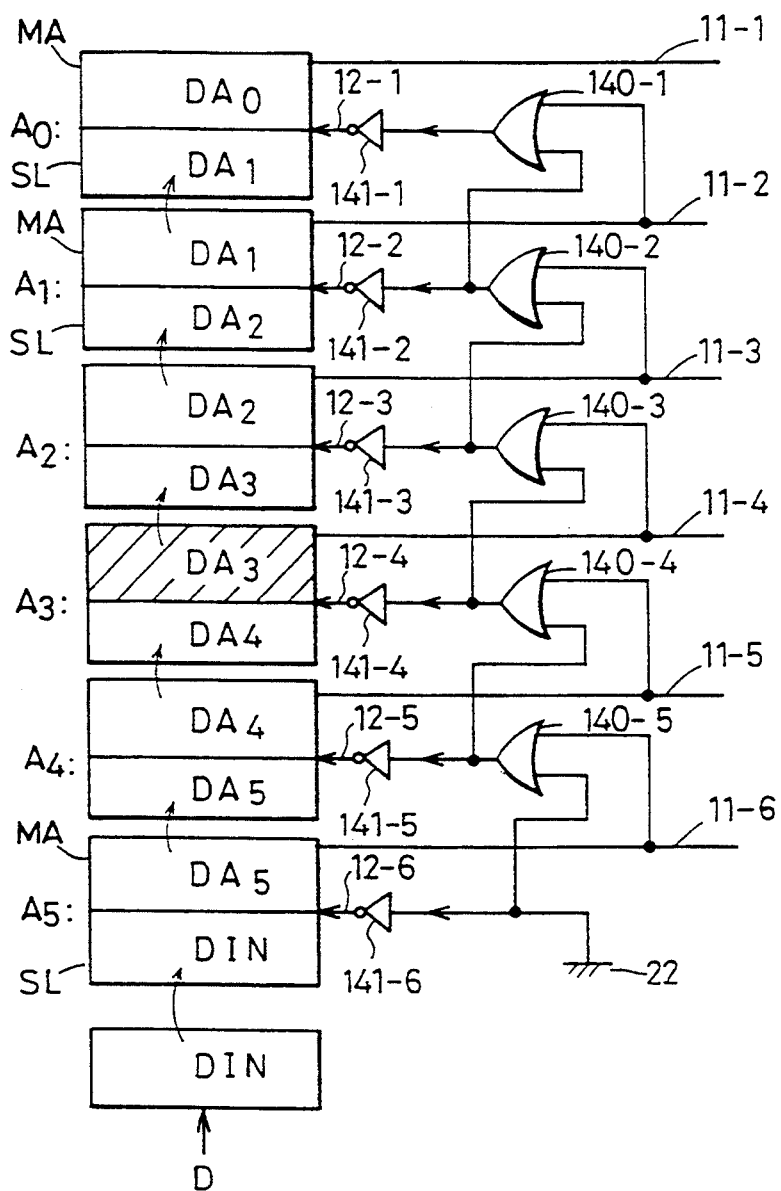
FIG. 4 is a diagram for showing the data shifting operation of a comparison operation phase in data rewrite operation mode in the content addressable memory circuit according to one embodiment of the present invention.

FIG. 4 schematically shows the flow of data during the comparison period "comp" in a CAM circuit having 6 words (6 addresses). Referring to FIG. 4, the CAM circuits have addresses A0–A5. Each of addresses A0–A5 has a master memory area MA and a slave memory area SL provided therein. A matching line 11 extends out from the master memory area MA. More specifically, matching lines 11-1 to 11-6 extend out from the master memory areas MA of addresses A0–A5, respectively.

A rewrite control circuit is provided corresponding to each address. More specifically, gate circuits 140-1 to 140-5 and 141-1 to 141-5 are provided for addresses A0–A4. A gate circuit 141-6 formed of an inverter is provided for address A5. Ground potential 22 is transmitted to the input of the gate circuit 41-6. Each of the gate circuits 140-1 to 140-5 receive a signal on a matching line of an adjacent row and the output of the gate circuit of the adjacent row. The gate circuit 140-5 of address A4 has one input coupled to ground potential 22. Gate circuits 141-1 to 141-6 respectively generate a rewrite instruct signal.

During the data comparison period "comp", an internal input data DIN is generated from an external data D to be transmitted to each of addresses A0–A5, whereby a comparison operation is executed. In parallel with the comparison operation, a data transfer operation is executed in addresses A0–A5. More specifically, data DA1–DA5 stored in the master memory areas MA of addresses A1–A5 are respectively stored into the slave memory areas SL of addresses A0–A4. An input data DIN is stored in the slave memory region SL of address A5. A case is considered where the data word DA3 stored in the master memory area MA of address A3 matches the input data DIN. This state is depicted in FIG. 5.

Figure 5:
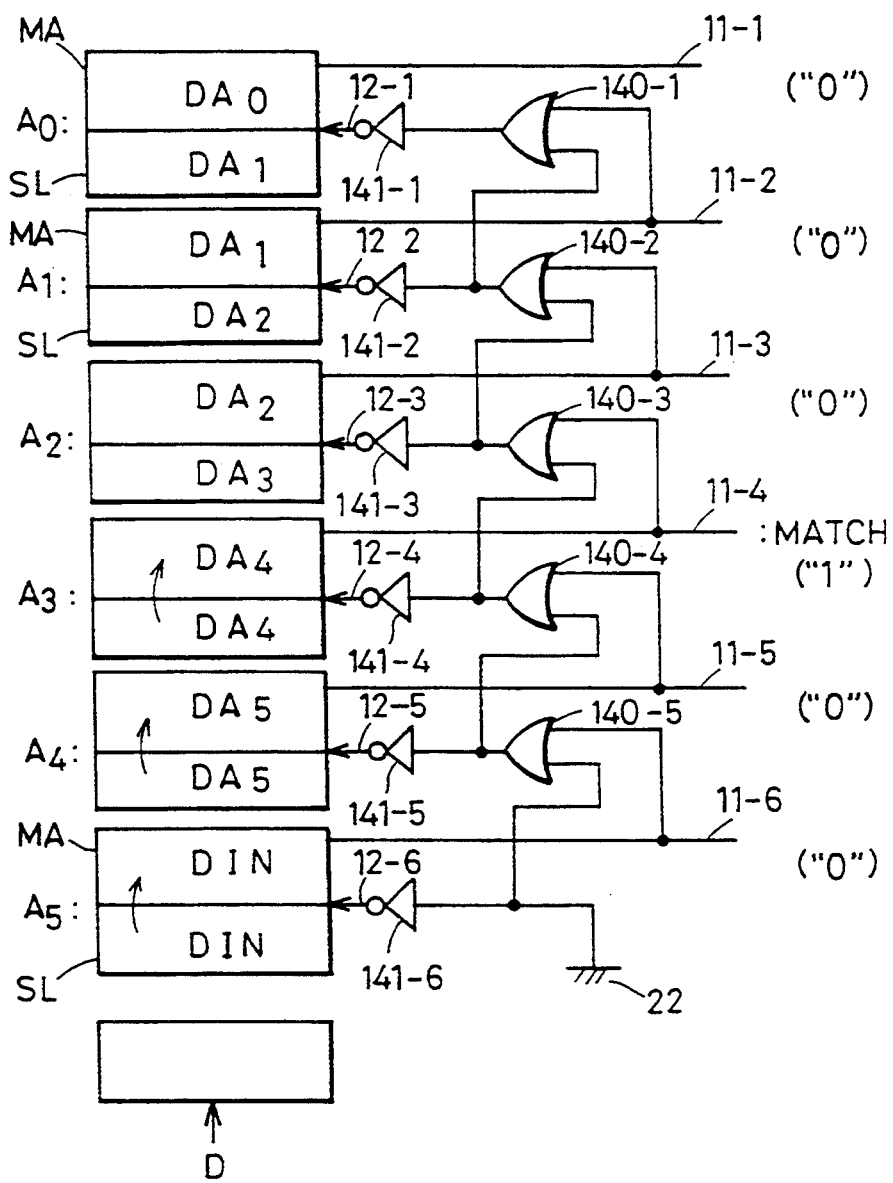
FIG. 5 shows the data transfer in a data rewrite phase in the content addressable memory circuit of the present invention.

Referring to FIG. 5, the matching signal of matching line 11-4 takes a logic value of "1", and the remaining matching lines 11-1 to 11-3, 11-5, and 11-6 take a logic value of "0", when address A3 is the hit address. Here, the outputs of gate circuits 140-1 to 140-3 become "1", and the outputs of gate circuits 140-4 and 140-5 become "0".

Then, a rewrite signal is generated from gate circuits 141-1 to 141-6. Gate circuits 141-1 to 141-6 are essentially inverter circuits. Therefore, a rewrite instruct signal of logic value "1" is generated for addresses A3–A5, and a rewrite signal of logic value "0" is applied to addresses A0–A2. As a result, addresses A3–A5 have the data stored in the slave memory area SL transferred to the master memory area MA. The input data DIN is identical to the data word DA3. This means that the most recently accessed data DA3 is stored in the greatest address A5. Data rewrite is carried out in hit address A3 and also in the addresses upstream of address A4. The data of the address greater than the hit address is transferred to one smaller address.

If all the matching lines 11-1 to 11-6 indicate mismatch, the logic values of matching lines 11-1 to 11-6 all take a value of "0". In this case, a rewrite instruct signal (logic value "1") is generated for addresses A0–A5, whereby addresses A0–A5 have the data stored in the slave memory areas SL transferred and rewritten into the master memory area MA. This means that the least recently accessed data DA0 stored in address A0 is removed, the newest or most recent data DIN is stored in the greatest address A5, and the data stored in each of addresses A1–A5 are shifted in the direction towards one smaller address. Thus, data rewrite along LRU algorithm is realized.

By using the above-described structure, the LRU algorithm conventionally executed with a software consuming a great period of time can now be executed in a hardware manner in a short time. In the case of the structure of the above-described embodiment, the gate circuit 4 receives the output of the gate circuit of an adjacent row. If the greatest address is the hit address (the address in which the stored data and the input data match), there will be an increase in the signal propagation delay because the transmission of logic value "1" via a gate circuit 4 sequentially up to the rewrite signal generating circuit 5-1 of one bit of the smallest address is time consuming for passing through each gate circuit 4 of all these addresses (gate circuits 4-1 to 4-(m-1) in FIG. 1). A structure for executing LRU algorithm with a reduced delay in signal transmission to result in an operation at a higher speed will be described hereinafter.

Figure 6:
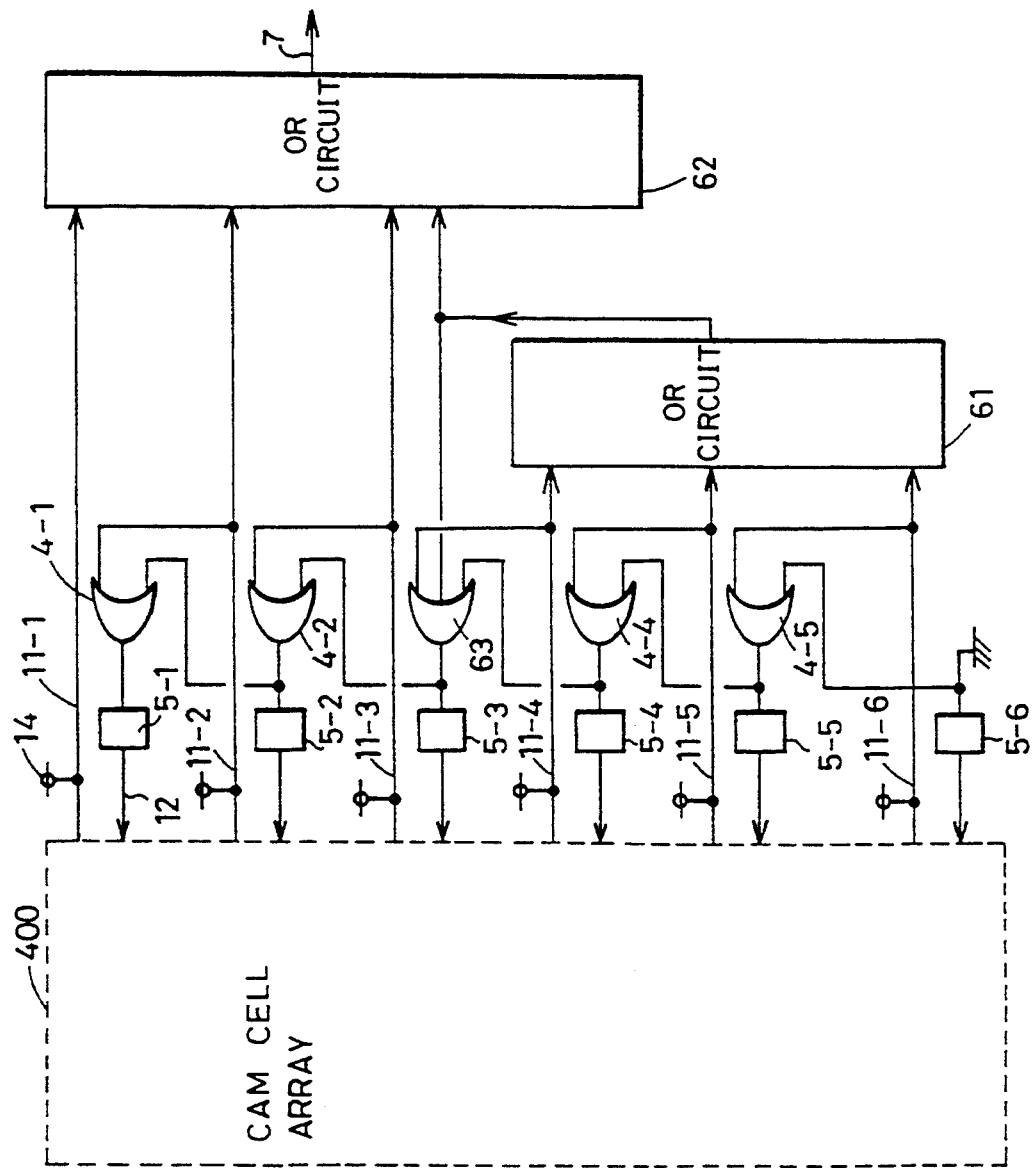
FIG. 6 shows a structure of the components of a content addressable memory circuit according to another embodiment of the present invention.

FIG. 6 shows a structure of the components of a CAM circuit according to another embodiment of the present invention. FIG. 6 shows an embodiment where six addresses, i.e. six rows of CAM cell circuits are arranged. Although CAM cell circuits corresponding to six addresses are arranged in the CAM cell array 400, the details thereof are not depicted in FIG. 6. The CAM cell array 400 has a structure similar to that of the CAM cell array shown in FIG. 1. Six matching lines 11-1 to 11-6 according to six addresses are provided in and extending from the CAM cell array 400. Matching lines 11-1 to 11-6 are divided into two groups. The first group includes matching lines 11-4 to 11-6, and the second group includes matching lines 11-1 to 11-3. The matching line 11-6 corresponds to the greatest address. The matching lines 11-4 to 11-6 of the first group are coupled to a first OR circuit 61, and the matching lines 11-1 to 11-3 of the second group are coupled to a second OR circuit 62. The output of the first OR circuit 61 is coupled to the input of the second OR circuit 62.

The output of the first OR circuit 61 is supplied to the input of the gate circuit 63 provided corresponding to a matching line proximate to the matching lines of the first group of the matching lines of the second group. The gate circuit 63 receives the output of the first OR circuit 61, the matching signal on the matching line 11-4, and the output of the gate circuit 4-4. A matching signal is provided to the signal line 7 from the second OR circuit 62. The operation thereof will be described hereinafter.

A case is considered where any of the matching lines 11-4 to 11-6 of the first group indicates a match. A signal of logic value "1" is transmitted to gate circuits 4-1 and 4-2 provided corresponding to the matching lines of the second group via the OR circuit 61 and the gate circuit 63 with a propagation delay of two stages of OR gates. In the arrangement shown in FIG. 1, there may be a signal transmission delay in which the maximum delay corresponds to the number of addresses. If the matching line 11-6 indicates a match in FIG. 6, for example, a signal of logic value "1" is transmitted to the gate circuit 4-1 via gate circuits (OR gates) 4-5, 4-6, 63, 4-2 if an OR circuit 61 is not provided. If an OR circuit 61 is provided, the signal of logic value "1" is transmitted to the gate circuit 4-1 via the OR circuit 61, the gate circuit 63, and the gate circuit 4-2. If the number of the matching lines is increased, the signal transmission delay time of the gate circuits corresponding to the matching lines of the first group can be eliminated to allow transmission of a signal of logic value "1" to the gate circuit of the smallest address at a high speed, resulting in a data rewrite operation at a high speed.

In the arrangement shown in FIG. 6, matching lines 11-1 to 11-6 are divided into two groups. The number of groups dividing the matching lines can be increased as the number of the matching lines is increased. If the matching lines are divided into 4 groups, for example, the maximum signal transmission delay can be reduced to approximately ¼ of the addresses of the CAM circuit.

The CAM circuits and CAM cell circuits shown in FIGS. 1 and 2 can select a word line by an address decoder circuit to access in a random sequence according to the address signal ADD. Rewrite and read out of the most oldly accessed data was conventionally carried out thereby. In the case a CAM circuit is used in a cache memory circuit or a TLB circuit, it is not particularly necessary to access the CAM circuit in a random sequence. This is because it is not particularly needed to read out the data once the data in the CAM circuit is rewritten. Furthermore, if stored contents such as the tag address to be rewritten is required, only an arrangement to read out data in the smallest address is required because it is always stored in the smallest address position.

The data to be written into this CAM circuit does not need to be written into a particular address. Only determination of a match/mismatch between an externally applied data and the data stored in the CAM cell is carried out, and which address of the CAM circuit the data is written to is not important. The management of the storage data according to the LRU algorithm is automatically executed internally.

Figure 7:
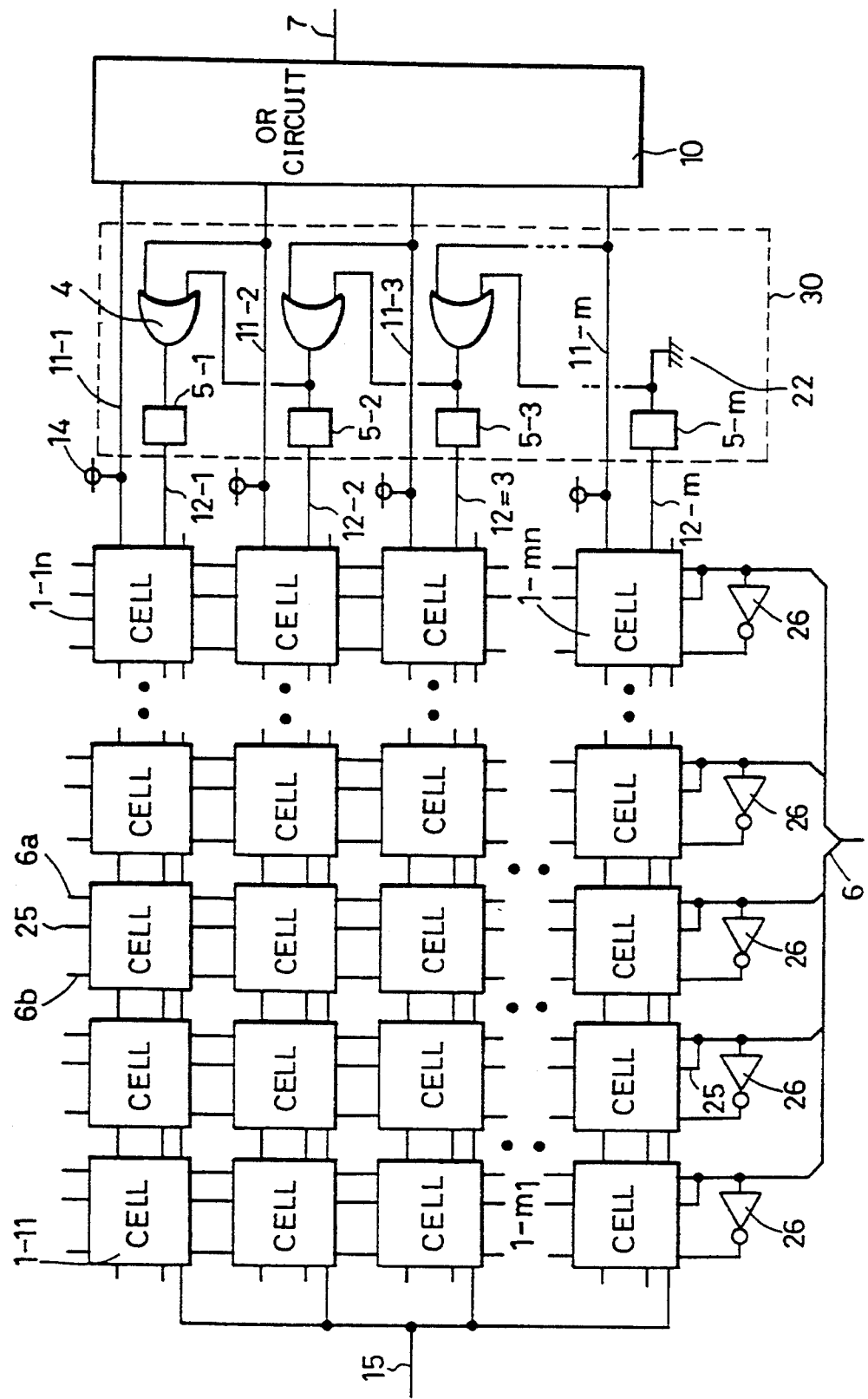
FIG. 7 is a block diagram showing an entire structure of a content addressable memory circuit according to a further embodiment of the present invention.

FIG. 7 schematically shows an entire structure of a CAM circuit according to a further embodiment of the present invention. The CAM circuit of FIG. 7 has the word line eliminated in the CAM cell array. Also, an address decoder circuit for selecting a word line is not provided. In FIG. 7, the CAM cell circuits 1 are arranged in a matrix of m rows and n columns. One matching line 11-k and one write data signal transmitting line 12-k are provided for each of CAM cell circuits 1-k1 to 1-kn. Bit lines 6a and 6b are provided for one column of CAM cell circuits 1-p1 to 1-pm. A data transmitting line 25 is provided for one CAM cell circuit.

Figure 8:
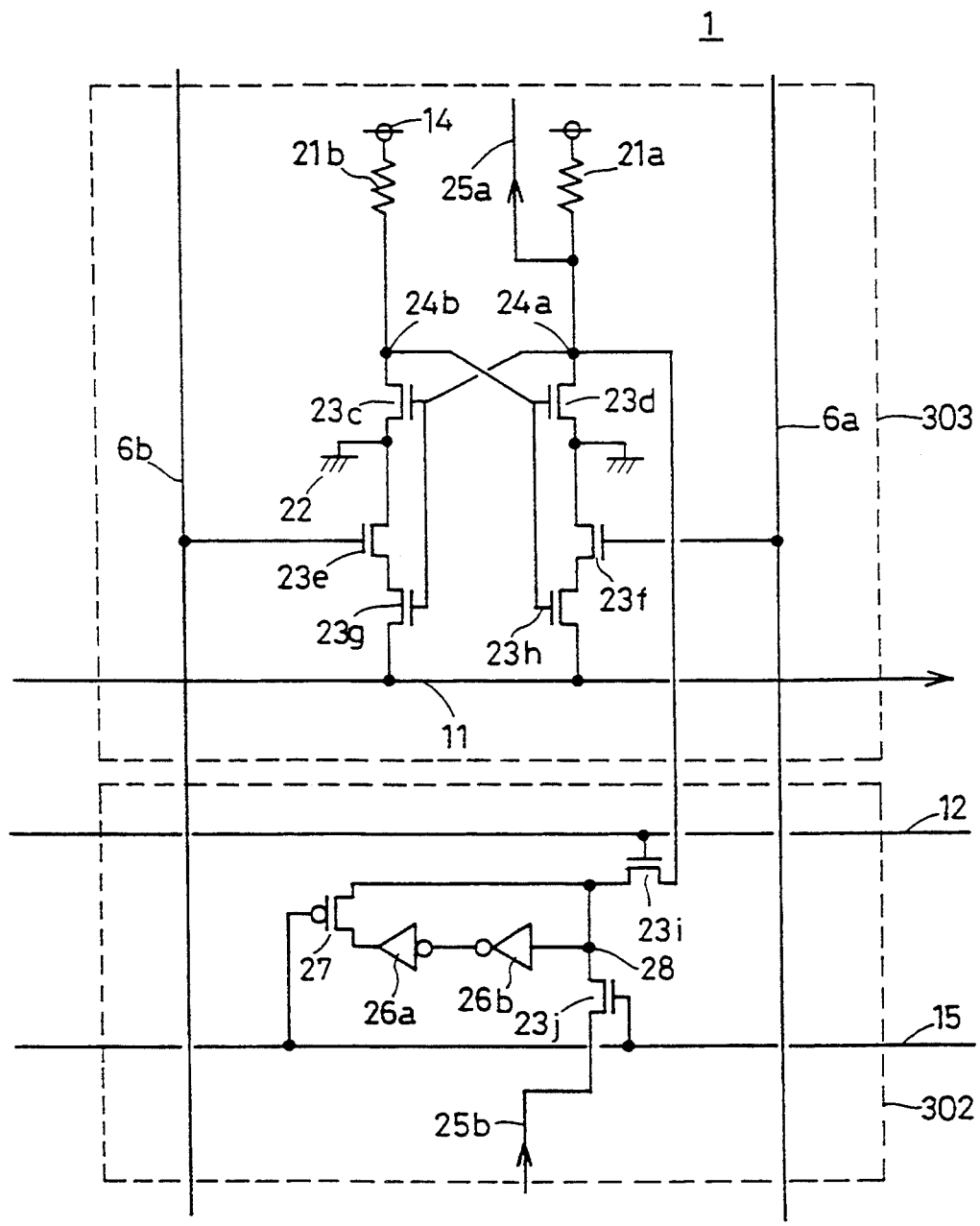
FIG. 8 specifically shows a structure of the CAM cell circuit of FIG. 7.
Figure 9:
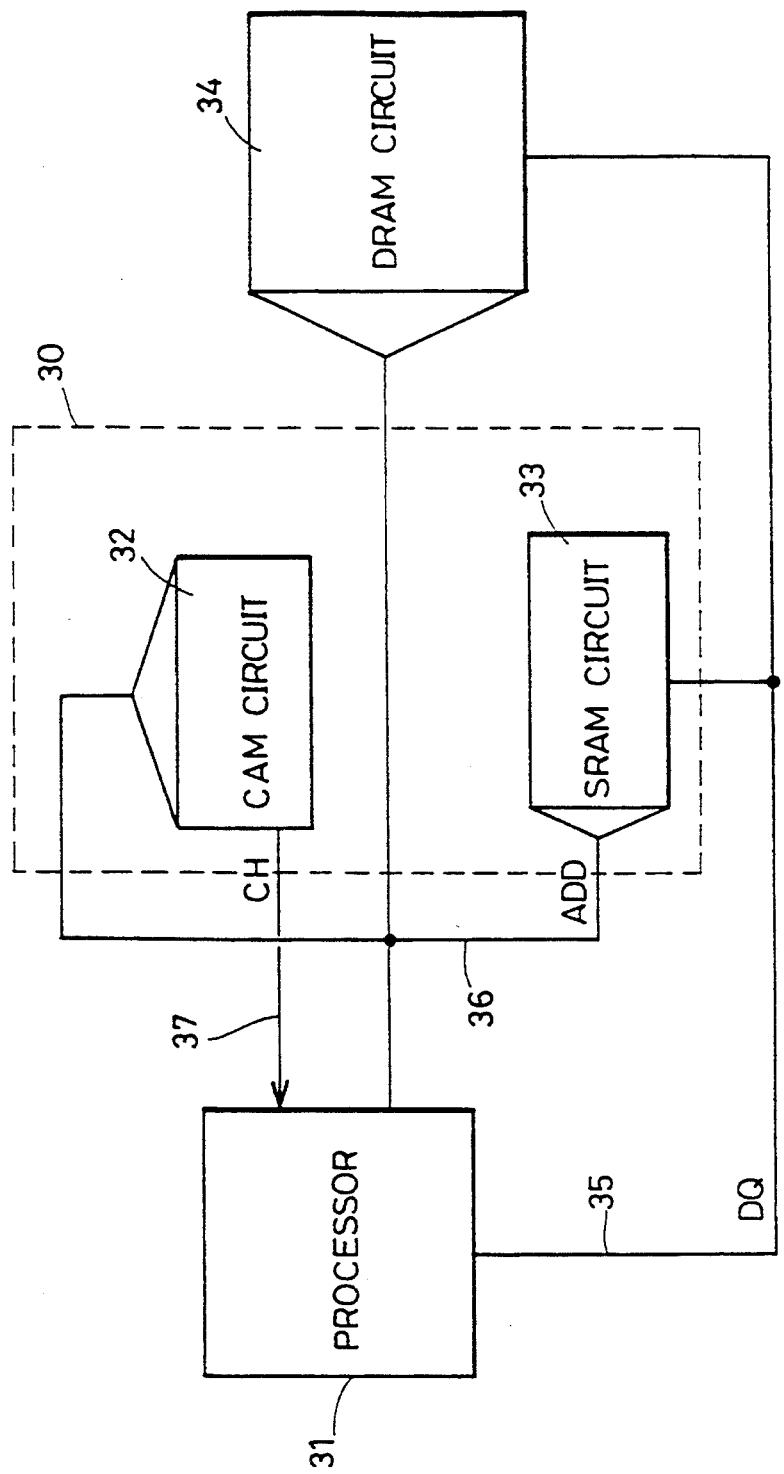
FIG. 9 shows a structure of a system employing a conventional cache memory.
Figure 10:
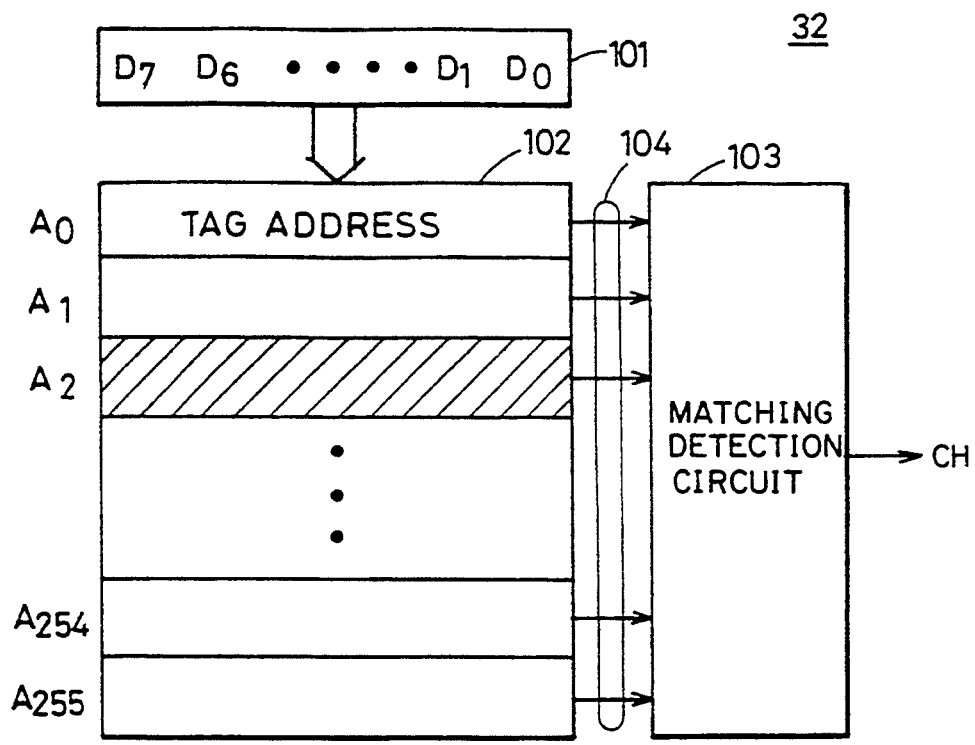
FIG. 10 is a diagram for describing the operation of a conventional CAM circuit.
Figure 11:
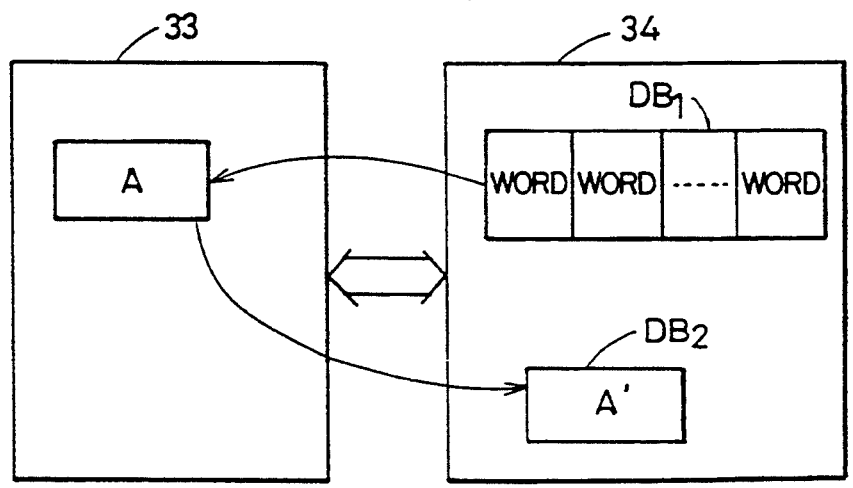
FIG. 11 is a diagram for describing a data transfer operation in cache miss in the cache memory.
Figure 12:
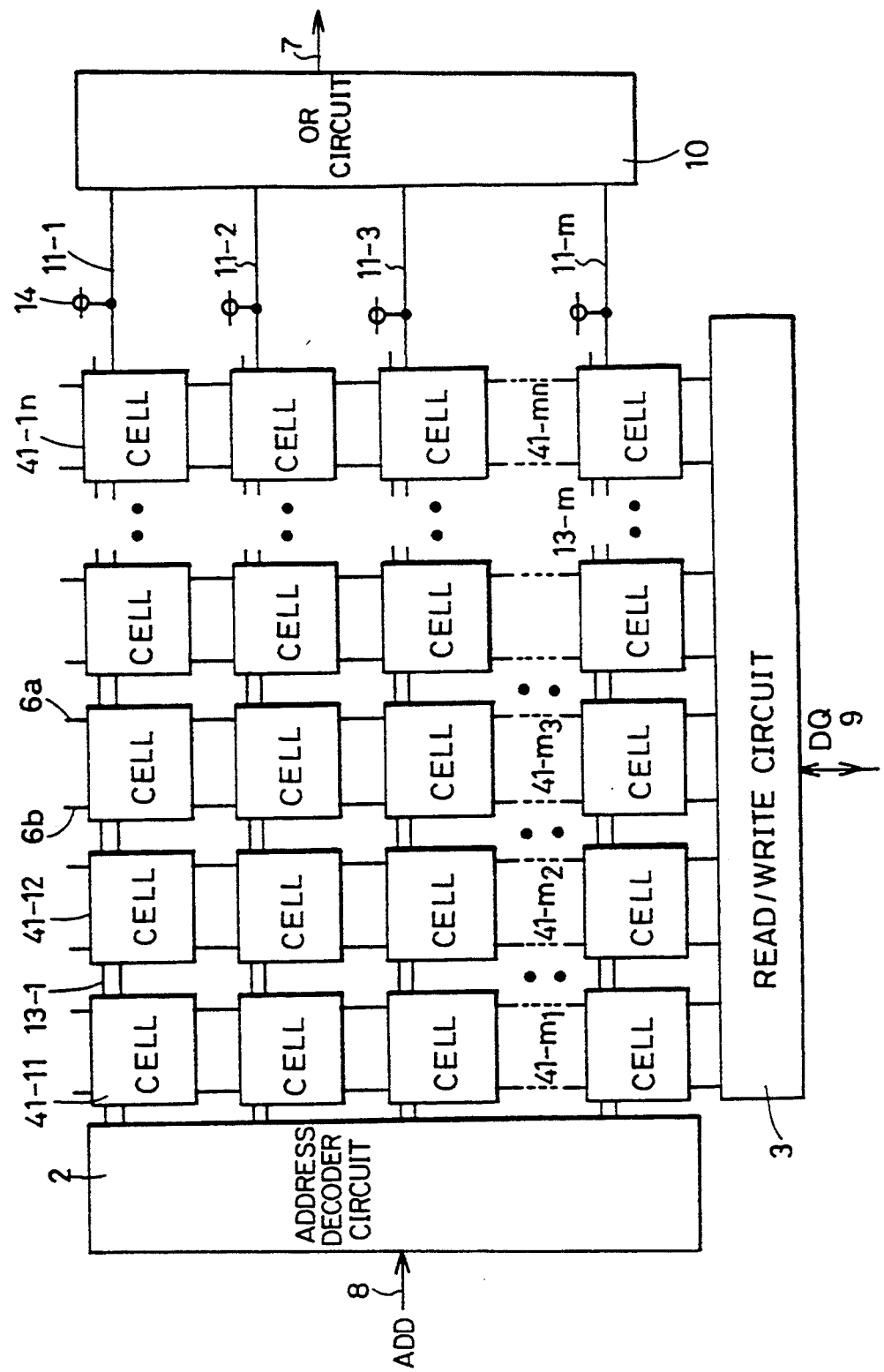
FIG. 12 shows an entire structure of a conventional content addressable memory circuit.

A transfer instruct signal is provided to CAM cell circuits 1-11 to 1-mn via the signal line 15. The input data is provided to the bit line 6a via the bus 6, and also to a complementary bit line 6b via an inverter circuit 26. The data bus 6 has a bit width identical to 1 word. The data transmitting line 25 for the word of the largest address (the row proximate to the data bus) is connected to the bit line 6a. The rewrite control circuit 300 and the OR circuit 10 have structures identical to those shown in FIG. 1. Because the CAM circuit of FIG. 7 does not carry out reading of an internal data in a random sequence, a read/write circuit is not provided. The data to be compared is provided to the data bus 6. FIG. 8 shows a more specific structure of the CAM cell circuit 1 of FIG. 7.

Referring to FIG. 8, the CAM cell circuit 1 includes a master memory portion 303 and a slave memory portion 302. The slave memory portion 302 has a structure similar to that of the CAM cell circuit of FIG. 2, and corresponding portions have the same reference characters denoted.

The master memory portion 303 has a structure similar to that of the master memory portion 301 of the CAM cell circuit of FIG. 2, except that the word line 13 and access transistors 23a and 23b are not provided. In the CAM cell circuit of FIG. 8, writing data into the master memory portion 303 is not carried out via bit lines 6a and 6b and the access transistors 23 and 23b. The data writing is carried out via the data transmitting line 25 (25a, 25b), and the slave memory portion 302.

The data transmitting line 25b of the slave memory portion 302 is connected to the storage node 24a of the master memory portion 303 of the CAM cell circuit of an adjacent word, or to the bit line 6a. The data transmitting line 25b is connected to the bit line 6a only in the CAM cell circuits in the word of the greatest address. The operation thereof will be described briefly hereinafter.

When an input data is supplied to the data bus 6, a signal corresponding to the input data is transmitted to bit lines 6a and 6b. By applying a transfer instruct signal to the signal line 15, the input data is stored into the slave memory portion 302 in the CAM cell circuits 1-m1 to 1-mn at the greatest address. Then, the comparison and rewrite operation is executed. When the first input data is stored in the slave memory portion 302 of the greatest address, the data word stored in the master memory portion and the input data stored in the slave memory portion will not match on carrying out a comparison operation. Therefore, a rewrite instruct signal is generated, whereby the data stored in the slave memory portion 302 in the largest address is transferred to be stored in the master memory portion 303. By providing a different input data to the bus 6 to carry out and the comparison and rewrite operation, data is sequentially written from the largest address. In the structure of the CAM circuit shown in FIGS. 7 and 8, data is sequentially written from the largest address word.

The most oldly accessed data is stored in the smallest address position. If the contents of this most oldly accessed data is to be read out, a data register for data output is to be provided at the data transmitting line 25a of the smallest address.

The CAM circuit of FIG. 7 may be implemented to force a generation of a rewrite signal by controlling the rewrite signal generating circuit 5 with a control circuit not shown (this generates a transfer instruct signal also to the signal line 15) when the stored contents are to be initialized, i,e. when initial data are to be stored in all the CAM cell circuits. In order to force a generation of a rewrite instruct signal, an arrangement is to be provided in which the inverter latch serving as a rewrite signal generating circuit required at the time of comparison/rewrite operation is made invalid to provide a signal of logic value "1" compulsorily.

In the embodiment of the CAM circuit and the CAM cell circuit of FIGS. 7 and 8, the address decoder circuit and the read/write circuit are not required. The CAM circuit can be implemented by repetitively arranging a CAM cell circuit of substantially the same structure. This repetition of the same circuit facilitates the layout of a CAM circuit, and improves the chip usage efficiency and the entire layout of the circuit.

The CAM circuit of the first embodiment is based on a memory circuit capable of random access, whereas the CAM circuit of the third embodiment of FIGS. 7 and 8 is based on a shift register circuit in which the oldest ancient data is removed when a new data is stored.

The structure shown in FIG. 6 may be applied in the CAM circuit of the third embodiment.

All the above-described embodiments have the largest address allocated to the CAM cell circuit proximate to the read/write circuit or the data bus. Conversely, the smallest address may be allocated to the CAM cell circuit proximate to the input data transmitting portion.

Although the potential of the matching line is held at a H level when the input data and the storage data match in the above-described embodiments, the present invention may be implemented so that the potential attains a L level in matching. In this case, the rewrite control circuit 300 may be implemented as an NAND type. Also, the OR circuit 10 and the like generating a match detection signal is replaced with an NAND type circuit.

The CAM circuit may be integrated on the same chip with the processor, or may be provided in separate chips.

According to the present invention, the LRU algorithm required in a TLB circuit or a cache memory circuit is realized in a hardware manner, so that the data rewriting process along LRU algorithm can be executed at a high speed.

Because the data of an adjacent word (an adjacent address) is transmitted, word line selection is not carried out in testing a memory cell of a CAM circuit, and test data can be written by carrying out only a data shift operation. Therefore, the time required for testing can be reduced significantly.

There is also the advantage of superior design efficiency because the present invention can be implemented with a circuit (the master memory portion of a CAM cell circuit) used in a conventional CAM circuit, with only the addition of a circuit of a slave memory portion. Because the CAM circuit can be implemented with a CAM cell circuit of the same structure repetitively in circuit units, designing is facilitated in realizing LSI (Large Scaled Integrated Circuit) to lower the cost of the CAM circuit.

The specific features and advantages of the present invention are as follows.

(1) A content addressable memory cell is implemented with a main storage portion (master memory portion) and a sub-storage portion (slave memory portion) receiving an adjacent word data for transferring data from the sub storage portion to the main storage portion according to a match/mismatch. It is possible to shift the storage position of the stored data by a rewrite instruct signal, providing a content addressable memory cell that can realize LRU algorithm with a compact structure.

(2) Because the input data is stored in the main storage portion, rewrite of the stored contents of the content addressable memory cell can be carried out easily and speedily. A content addressable memory cell that can realize LRU algorithm efficiently can be obtained with a compact structure.

(3) Because shifting of a stored data word is carried out according to a match/mismatch of input data and stored data, and because the input data is always stored in a particular address position, a content addressable memory circuit can be obtained that realizes management of stored contents according to LRU algorithm effectively with a simple circuit structure.

(4) Because all the stored data in all the content addressable memory cells are rewritten by the data in an adjacent word or by an input data at the time of mismatch in the content addressable memory circuit, the rewrite of stored contents can be realized easily and speedily according to LRU algorithm.

(5) Because the input data is always stored in a storage position (address) holding the most recently accessed storage contents, and because the shifting position of the data word is easily determined by the gating means in a content addressable memory circuit, the shifting position of data can be determined speedily to properly carry out shifting of the stored data. Also, management of the stored data and data rewrite using LRU algorithm can be realized easily and speedily.

(6) Because first and second match/mismatch determination circuits are provided wherein the output of the first determination circuit is used as a rewrite determination control signal in a content addressable memory circuit, the gate delay can be significantly reduced in rewrite presence/absence determination to generate a data rewrite instruct signal speedily.

(7) In another content addressable memory cell, the word line is not provided, and storage of the data of an adjacent word is carried out according to only a shifting operation to realize LRU algorithm with a simple structure.

(8) According to another content addressable memory cell, the word line is not provided, and the data on the bit line is stored by a rewrite instruct signal. It is therefore to rewrite the stored data with an input data easily and speedily to obtain a content addressable memory cell that can realize LRU algorithm with a compact structure.

(9) In another content addressable memory circuit, a decoder circuit for word line selection is not required because the word line is not provided, and rewrite of the stored data is executed by just a shifting operation. A content addressable memory circuit of a compact structure that can realize LRU algorithm speedily can be obtained.

(10) According to another content addressable memory circuit, a word line is not provided, and all the stored contents are updated by a shifting operation when the input data does not match the stored data to realize an operation similar to that of a FIFO type memory circuit. A content addressable memory circuit that can realize LRU algorithm speedily with a simple and compact circuit configuration can be obtained.

(11) According to another content addressable memory circuit, the word line is not provided, the stored contents are rewritten by a shifting operation, and the shifting position is determined speedily with gate means. Therefore, a content addressable memory circuit can be obtained that can execute LRU algorithm easily and speedily.

(12) According to another content addressable memory circuit, matching lines are divided into groups with a match/mismatch determination circuit provided for each group, whereby the output of the match/mismatch determination circuit is provided, as a control signal, to the rewrite control portion for the matching lines of the group of the downstream side. The gate delay can be reduced significantly in transmitting the signal indicating the match determination result, and a data rewrite instruct signal is generated at high speed. A content addressable memory circuit can be obtained that can realize LRU algorithm at a higher speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content addressable memory cell provided corresponding to a crossing between a bit line and a matching line to compare an applied data with a stored data to drive said matching line according to the comparison result, comprising main storage means for storing data,
comparison means for comparing the data on said bit line with the data stored in said main storage means for driving said matching line according to match and mismatch of both data,
sub-storage means for storing data,
data transfer means responsive to a transfer instruct signal for transferring and storing into said sub-storage means the data stored in the main storage means of a memory cell adjacent along said bit line, and
data rewriting means responsive to a rewrite instruct signal for transferring and storing into said main storage means the data stored in said sub-storage means.

2. A memory cell provided corresponding to a crossing between a bit line and a matching line to compare an applied data with a stored data to drive said matching line according to the comparison result, comprising:

main storage means for storing data, comparison means for comparing a data applied on said bit line with a data stored in said main storage means to drive said matching line according to the comparison result, sub-storage means for storing data, transfer means responsive to a transfer instruct signal for transferring to said sub-storage means the data applied on said bit line, and data rewrite means responsive to a rewrite instruct signal for transferring and storing into said main storage means the data stored in said sub-storage means.

3. A content addressable memory circuit comprising:

a plurality of bit lines each defining a column, a plurality of matching lines arranged in a direction crossing said bit lines, and a plurality of memory cells provided corresponding to crossings between said matching lines and said bit lines, wherein each of said memory cells comprises main storage means for storing data, a data transmitting line to which the stored data in the main storage means of a memory cell adjacent in a direction where said bit lines extend or the data on an associated bit line is transferred, sub-storage means for storing data, means responsive to a data transfer instruct signal for transmitting to said sub-storage means the data on said data transmitting line, rewrite means responsive to a rewrite instruct signal for transmitting to said main storage means the data stored in said sub-storage means, and comparison means for comparing the data on said associated bit line with the data stored in said main storage means to drive an associated matching line according to the comparison result, wherein the coupling of said data transmitting line and an associated bit line is carried out only for a memory cell associated with one matching line of said plurality of matching lines, and rewrite control means responsive to signals from said plurality of matching lines for generating said rewrite instruct signal in a unit of memory cells associated with each matching line, said rewrite control means comprising dividing means for grouping said plurality of matching lines into a first group of continuously adjacent matching lines including a matching line indicating a match and a matching line corresponding to a memory cell having a data transmitting line connected to said associated bit line, and a second group of the remaining matching lines, and rewrite signal generating means responsive to an output of said dividing means for providing said rewrite instruct signal only to a memory cell corresponding to the matching line of said first group.

4. The content addressable memory circuit according to claim 3, wherein said rewrite control means further comprises means for providing said rewrite instruct signal to all the memory cells when all of said plurality of matching lines indicate a mismatch.

5. A content addressable memory circuit comprising:

a plurality of bit lines each defining a column, a plurality of matching lines arranged in a direction crossing said bit lines and each defining a row, a plurality of memory cells provided corresponding to crossings between said matching lines and said bit lines, each of said memory cells comprising main storage means for storing data, a data transmitting line to which the stored data in the main storage means of a memory cell adjacent in a direction where the bit lines extend or the data on an associated bit line is transferred, sub-storage means for storing data, means responsive to a data transfer instruct signal for transmitting the data on said data transmitting line to said sub-storage means, rewrite means responsive to a rewrite instruct signal for transferring the data stored in said sub-storage means to said main storage means, and comparison means for comparing the data on said associated bit line with the data stored in said main storage means to drive an associated matching line according to the comparison result, the coupling of said data transmitting line and an associated bit line being carried out with respect to only a memory cell associated with one matching line out of said plurality of matching lines, a plurality of gate means provided corresponding to each row excluding the row of a memory cell having said data transmitting line and said associated bit line coupled, each of said gate means receiving a signal on a matching line of an adjacent row and an output signal of the gate means provided corresponding to said adjacent row for generating a match indicating signal when at least one of the signals received by said gate means indicates a matching state, means provided corresponding to each of said gate means for transmitting said rewrite instruct signal to each memory cell of an associated row when the output of a corresponding gate means differs in logic state from said match indicating signal, and means provided corresponding to a row of a memory cell having said data transmitting line and said associated bit line connected, and including a fixed potential generating means, and responsive to an output of said fixed potential generating means for generating and providing to a memory cell of the corresponding row a rewrite instruct signal, the output of said fixed potential generating means being provided to the gate means of a row adjacent to said corresponding row.

6. The content addressable memory circuit according to claim 5, further comprising:

first determination means provided corresponding to a first group of continuously adjacent matching lines including a matching line corresponding to a row of a memory cell having said data transmitting line and said associated bit line connected, to receive a signal on a matching line of said first group for making determination of a match and mismatch between an applied data and a stored data, second determination means provided corresponding to a second group of the remaining matching lines, and responsive to each output of said matching lines of said second group and an output of said first determination means for making determination of a match and mismatch between an applied data and a stored data, the output of said first determination means being applied to an input of a gate means provided corresponding to a matching line of said second group proximate to said first group.

* * * * *